(12) United States Patent
Hayashi

(10) Patent No.: US 8,907,367 B2
(45) Date of Patent: Dec. 9, 2014

(54) LIGHT EMISSION DEVICE

(71) Applicant: Panasonic Corporation, Osaka (JP)

(72) Inventor: Shintaro Hayashi, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/343,038

(22) PCT Filed: Oct. 3, 2012

(86) PCT No.: PCT/JP2012/075722
§ 371 (c)(1),
(2), (4) Date: Mar. 5, 2014

(87) PCT Pub. No.: WO2013/051633
PCT Pub. Date: Apr. 11, 2013

(65) Prior Publication Data
US 2014/0197403 A1    Jul. 17, 2014

(30) Foreign Application Priority Data
Oct. 4, 2011 (JP) ................... 2011-219785

(51) Int. Cl.
| H01L 33/00 | (2010.01) |
| H01L 23/02 | (2006.01) |
| H01L 51/52 | (2006.01) |
| H01L 51/50 | (2006.01) |
| H05B 33/26 | (2006.01) |
| G02F 1/1335 | (2006.01) |

(52) U.S. Cl.
CPC ............ H01L 51/5203 (2013.01); H01L 51/50 (2013.01); H05B 33/26 (2013.01); *H01L 51/524* (2013.01); *G02F 1/133602* (2013.01)
USPC .................. 257/98; 257/99; 257/680

(58) Field of Classification Search
None
See application file for complete search history.

(56) References Cited

U.S. PATENT DOCUMENTS

| 6,946,789 | B2 | 9/2005 | Ikeda |
| 8,421,340 | B2 | 4/2013 | Takamura |
| 2003/0168967 | A1 | 9/2003 | Ikeda |
| 2010/0264430 | A1 | 10/2010 | Takamura |

FOREIGN PATENT DOCUMENTS

| JP | 07-162155 A | 6/1995 |
| JP | 10-275965 A | 10/1998 |
| JP | 2003-257629 A | 9/2003 |

(Continued)

OTHER PUBLICATIONS

International Search Report issued in International Application No. PCT/JP2012/075722 with Date of mailing Translation. Dec. 25, 2012, with English Translation.

*Primary Examiner* — Scott B Geyer
(74) *Attorney, Agent, or Firm* — McDermott Will & Emery LLP

(57) ABSTRACT

A light emission device includes: an organic electroluminescent element including and second electrodes; a wiring board including first and second patterned conductors; and first and second connection parts. The first and the second electrodes include first and second extended portions. The first and the second extended portions overlap the first and the second patterned conductors, respectively. The first connection part includes a first through-hole wire and a first protrusion electrode protruding from the first patterned conductor to be inside the first through-hole wire so as to be electrically connected to the first through-hole wire. The second connection part includes a second through-hole wire and a second protrusion electrode protruding from the second patterned conductor to be inside the second through-hole wire so as to be electrically connected to the second through-hole wire.

9 Claims, 18 Drawing Sheets

(56) References Cited

FOREIGN PATENT DOCUMENTS

| | | |
|---|---|---|
| JP | 2005-072270 A | 3/2005 |
| JP | 2005-345935 A | 12/2005 |
| JP | 2006-032056 A | 2/2006 |
| JP | 2007-200626 A | 8/2007 |
| JP | 2009-152147 A | 7/2009 |
| JP | 2011-165444 A | 8/2011 |
| JP | 2011-175797 A | 9/2011 |

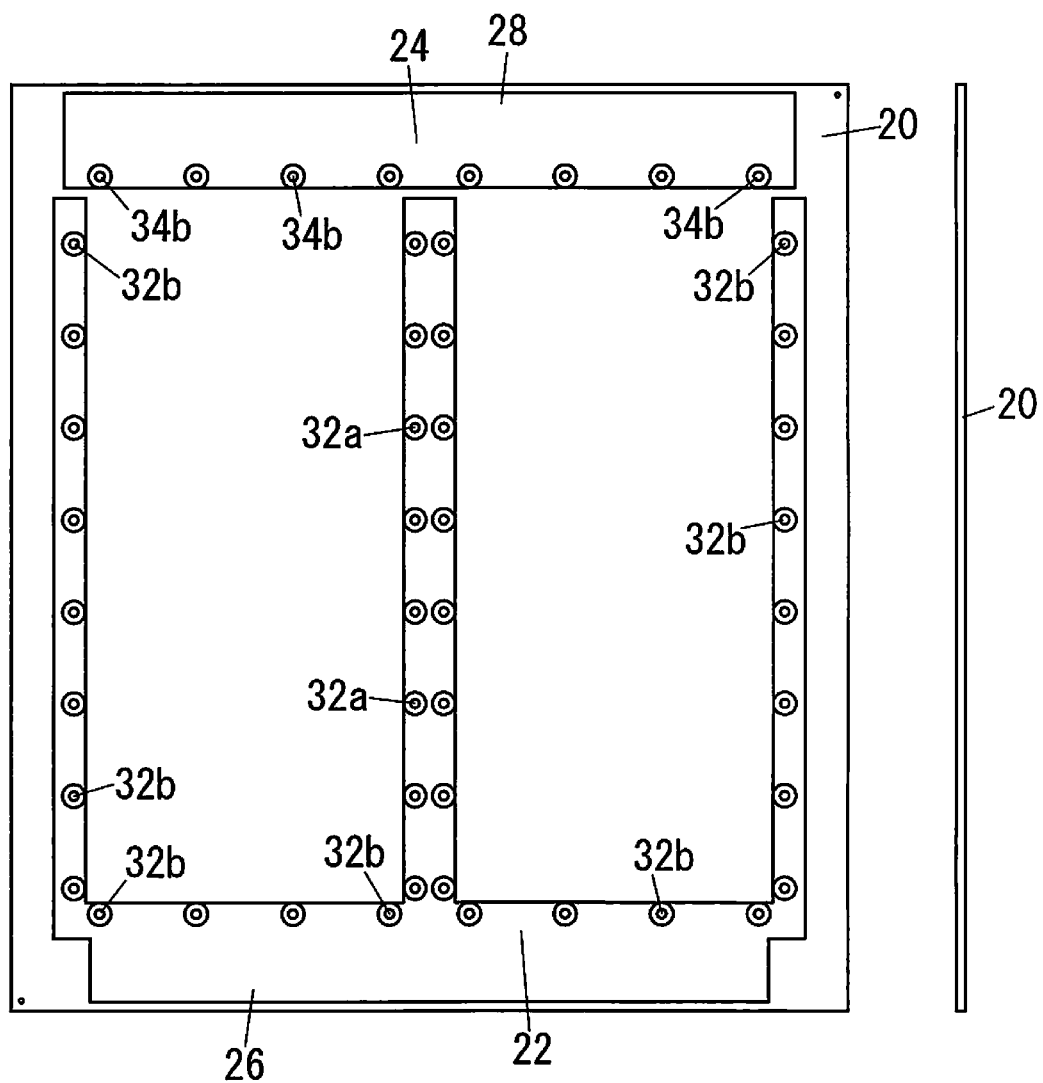

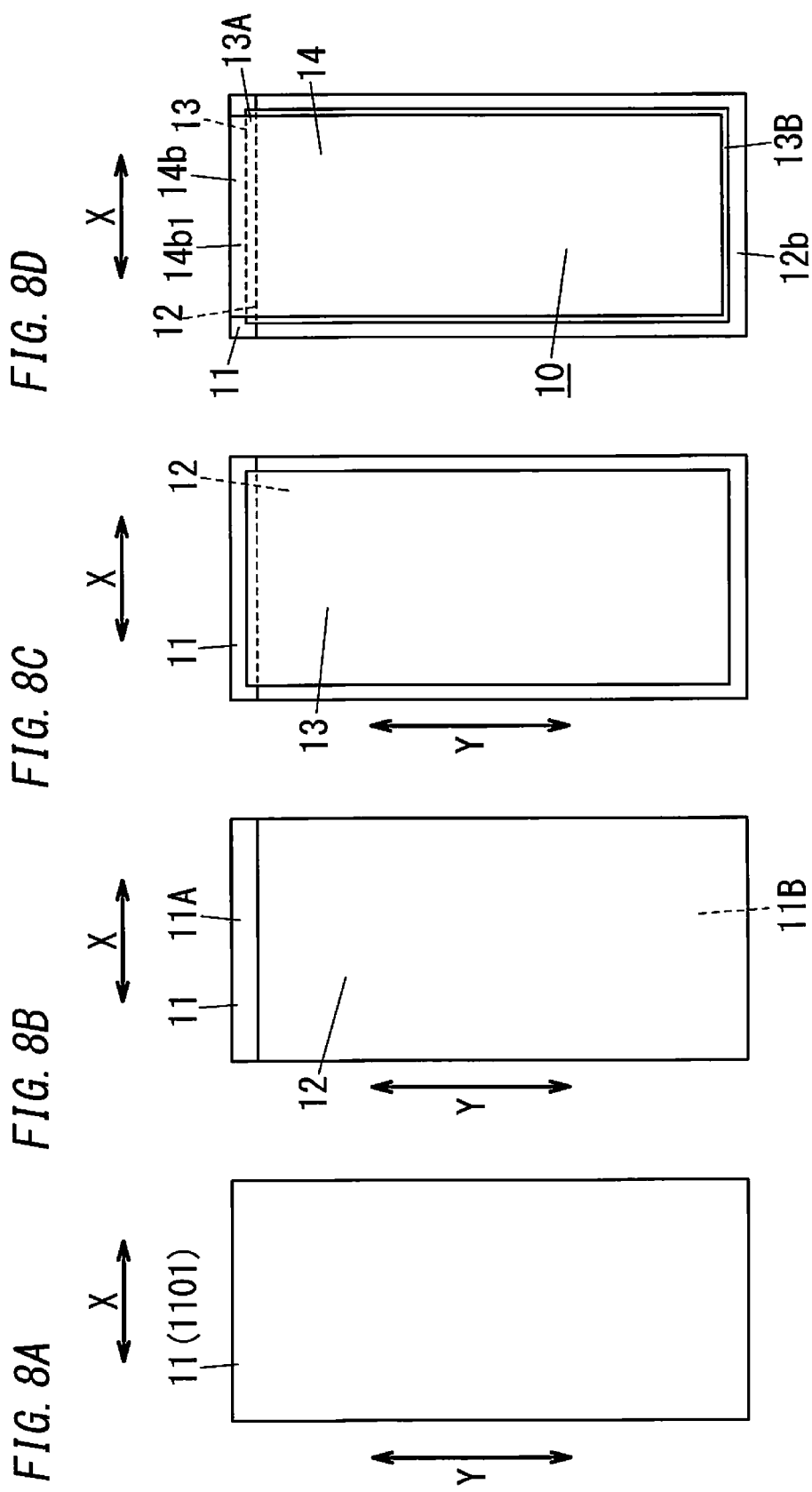

LIGHT EMISSION DEVICE

RELATED APPLICATIONS

This application is the U.S. National Phase under 35 U.S.C. §371 of International Application No. PCT/JP2012/075722, filed on Oct. 3, 2012, which in turn claims the benefit of Japanese Application No. 2011-219785, filed on Oct. 4, 2011, the disclosures of which Applications are incorporated by reference herein.

TECHNICAL FIELD

The present invention relates to light emission devices.

BACKGROUND ART

An organic electroluminescent element has features such as being self-luminous, exhibiting relatively highly efficient light-emitting characteristics, and being able to emit light of various tones. Organic electroluminescent elements are expected to be applied as a display device (such as a light-emitting body for a flat-panel display) and as a light source (such as a backlight of a liquid crystal display apparatus and for illumination), and they have been already put into practical use in some field.

Here, as a light emission device including an organic electroluminescent element, a light emission device shown in FIG. 30 is proposed in JP2011-165444 A (hereinafter referred to as Document 1).

A light emission device as shown in FIG. 30 includes a transparent substrate 110, an organic EL element 120 on a first surface of the transparent substrate 110, and an uneven structure 130 that is on a second surface of the transparent substrate 110 and is configured to suppress a reflection, at the second surface, of light emitted from the organic EL element 120. The light emission device further includes a package substrate 140 disposed over the second surface of the transparent substrate 110 and a protector 150 covering an opposite side of the organic EL element 120 from the transparent substrate 110, the protector 150 being for preventing a moisture from reaching the organic EL element 120. In the light emission device, a space 170 is present between the uneven structure 130 and the package substrate 140.

In the organic EL element 120, an anode 122 and a cathode 124 include portions extended to regions of the first surface of the transparent electrode 110. The regions do not overlap a light-emitting layer. Parts of the extended portions of the anode 122 and the cathode 124 function as pads 122a and 124a, respectively.

Furthermore, in the light emission device, the package substrate 140 has a face opposite the transparent substrate 110, and external connection electrodes 142 and 144 are provided on this face of the package substrate 140. The external connection electrodes 142 and 144 are connected to pads 122a and 124a via connection parts 132 and 134, respectively. The connection parts 132 and 134 are bonding wires.

The protector 150 is formed of a glass substrate. The protector 150 formed of the glass substrate is bonded to the package substrate 140 with a bond 180 formed of fritted glass.

In the light emission device as shown in FIG. 30, electrical connections between the pad 122a and the external connection electrode 142 and between the pad 122b and the external connection electrode 144 are made through the connection parts 132 and 134 which are bonding wires, respectively.

Therefore, an area of a non-light emitting portion is increased, and this causes to depreciate the design.

SUMMARY OF INVENTION

The present invention has been made in view of the above insufficiencies, and the object thereof is to provide a light emission device with a reduced area of a non-light emitting portion.

Solution to Problem

According to a first aspect of the present invention, there is provided a light emission device including: an organic electroluminescent element including a first substrate, a functional layer, a first electrode, and a second electrode, the functional layer being disposed over a surface of the first substrate and including light-emitting layer; a wiring board including a second substrate, a first patterned conductor, and a second patterned conductor, the first patterned conductor and the second patterned conductor being disposed on a surface of the second substrate; a first connection part electrically connected to the first electrode and the first patterned conductor; and a second connection part electrically connected to the second electrode and the second patterned conductor. The first electrode and the second electrode include a first extended portion and a second extended portion which extend outside from sides of a light-emitting unit, respectively. The light-emitting unit is an overlap of the first electrode, the functional layer, and the second electrode. The first extended portion and the second extended portion overlap the first patterned conductor and the second patterned conductor in a thickness direction, respectively. The organic electroluminescent element further includes a first through hole and a second through hole. The first through hole penetrates the first extended portion and the first substrate. The second through hole penetrates the second extended portion and the first substrate. The first connection part includes a first through-hole wire and a first protrusion electrode. The first through-hole wire has a hollow cylindrical shape and is inside the first through hole. The first protrusion electrode protrudes from the first patterned conductor along the thickness direction to be inside the first through-hole wire so as to be electrically connected to the first through-hole wire. The second connection part includes a second through-hole wire and a second protrusion electrode. The second through-hole wire has a hollow cylindrical shape and is inside the second through hole. The second protrusion electrode protrudes from the second patterned conductor along the thickness direction to be inside the second through-hole wire so as to be electrically connected to the second through-hole wire.

It is preferable that the light emission device includes a cover cooperating with the wiring board to accommodate the organic electroluminescent element and a resin member between the organic electroluminescent element and the cover in a thickness direction of the organic electroluminescent element.

It is preferable that, in the light emission device, each of the first protrusion electrode and the second protrusion electrode is provided with a spacer to keep the second substrate and the organic electroluminescent element separated by a distance.

It is preferable that, in the light emission device, each of the first protrusion electrode and the second protrusion electrode has an end having a tapered shape.

It is preferable that the light emission device includes a plurality of first substrates, and the plurality of first substrates are arranged over the second substrate in such a manner to form a light-emitting module having at least one electrical path defining series and/or parallel electrical interconnection on the plurality of first substrates.

It is preferable that, in the light emission device, the at least one electrical paths has a bend.

It is preferable that, in the light emission device, the light-emitting module has parts electrically interconnected in parallel through the first patterned conductor formed into a comb shape.

It is preferable that the light emission device includes two or more sets of the electrical paths each defining series electrical interconnection, and the number of first substrates through which one of the two or more electrical paths pass is the same as the number of first substrates through which another of the two or more electrical paths pass.

It is preferable that the light emission device includes a plurality of organic electroluminescent elements including the plurality of first substrates and a single cover which covers the plurality of organic electroluminescent elements.

According to the light emission device in accordance with the present invention, it is possible to reduce an area of a non-light emitting portion.

BRIEF DESCRIPTION OF DRAWINGS

FIG. 5 includes FIGS. 5A, 5B, and 5C, and FIG. 5A is a schematic plan view of a wiring board of the light emission device of Embodiment 1;

FIGS. 8A to 8D are explanatory drawings of a layered structure of the organic electroluminescent element in the light emission device of Embodiment 1;

DESCRIPTION OF EMBODIMENTS

Embodiment 1

Figure 1:
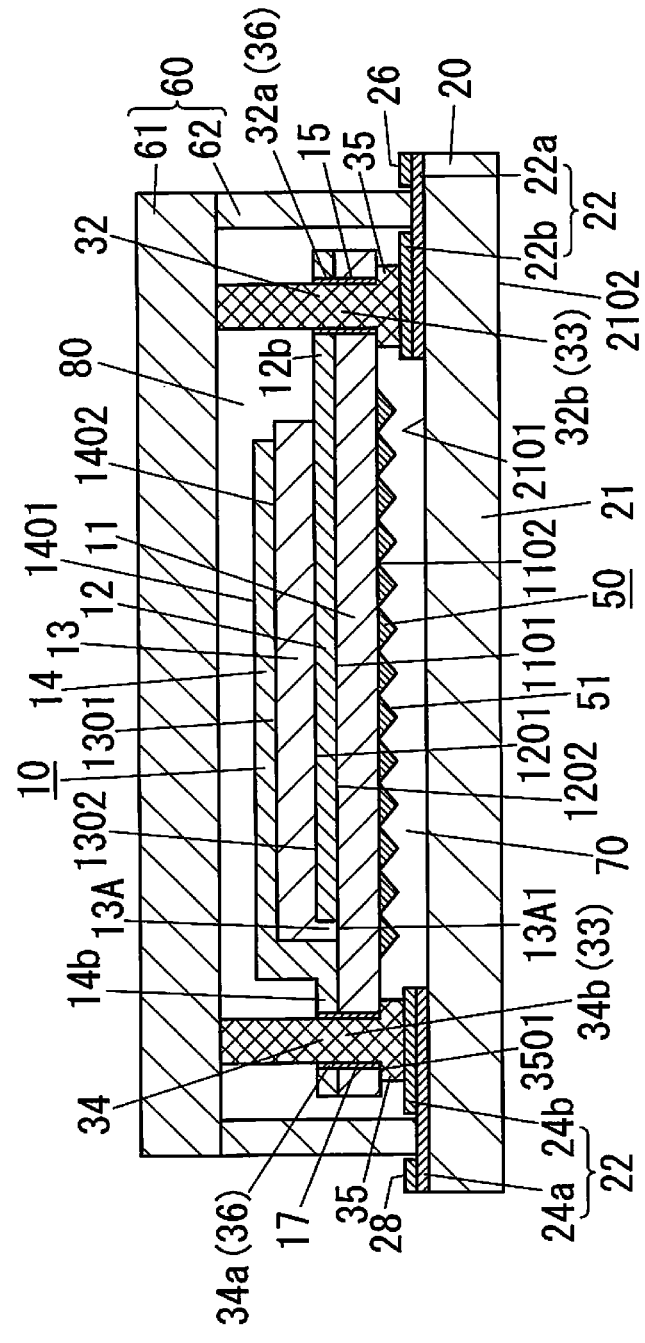
FIG. 1 is a schematic cross-sectional view of a light emission device of Embodiment 1.
Figure 2A:
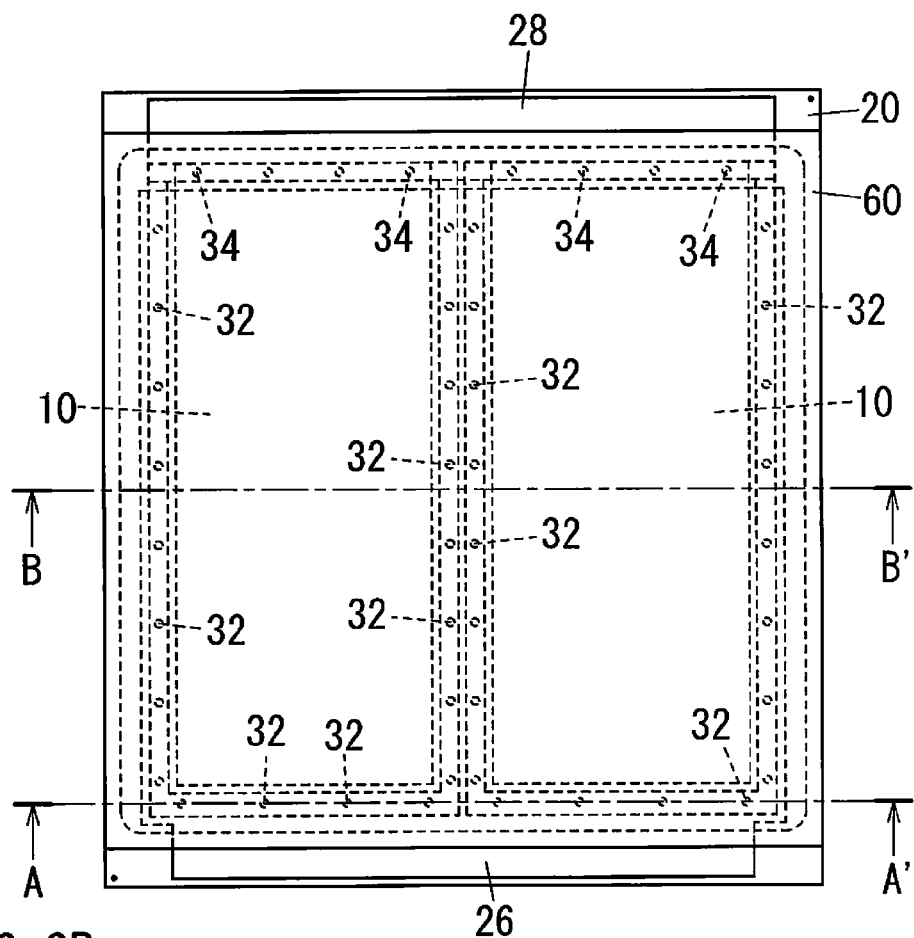
FIG. 2A is a schematic plan view of the light emission device of Embodiment 1.
Figure 2B:
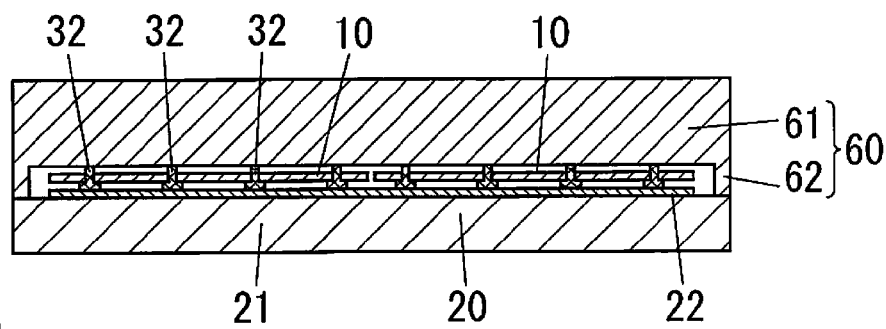
FIG. 2B is a schematic cross-sectional view taken along A-A' in FIG. 2A.
Figure 2C:
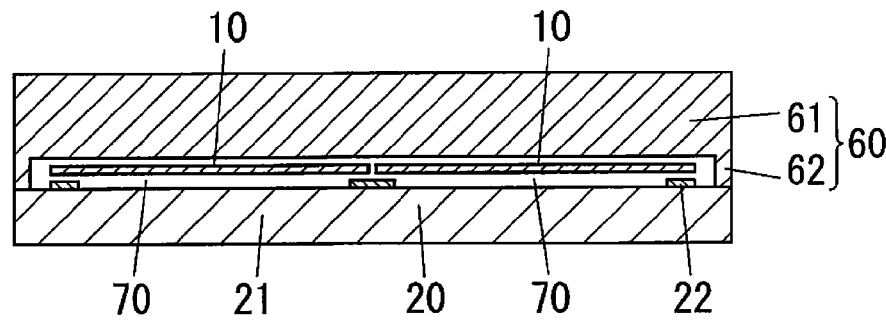
FIG. 2C is a schematic cross-sectional view taken along B-B' in FIG. 2A.
Figure 3:
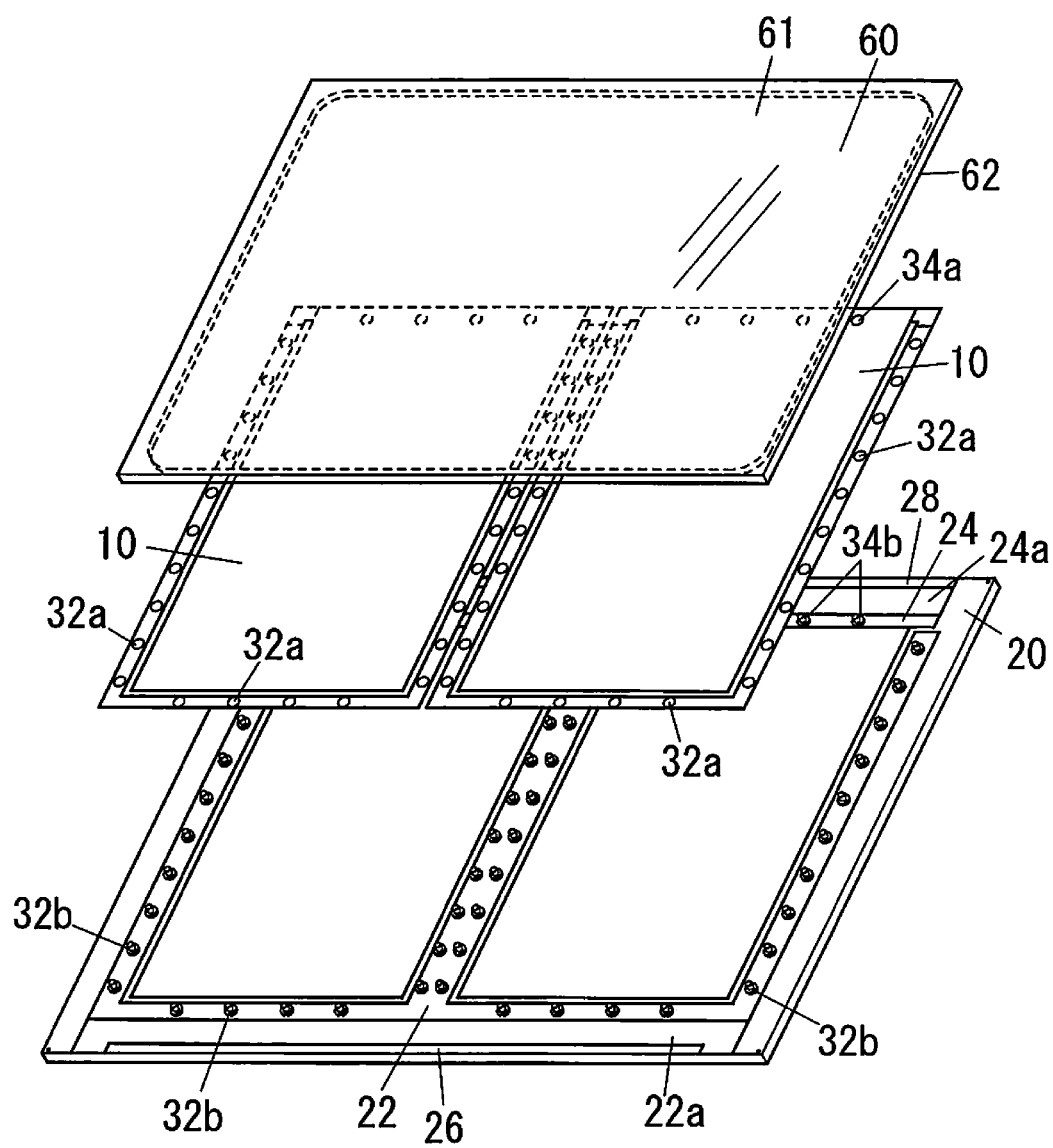
FIG. 3 is an exploded perspective view of the light emission device of Embodiment 1.
Figure 4:
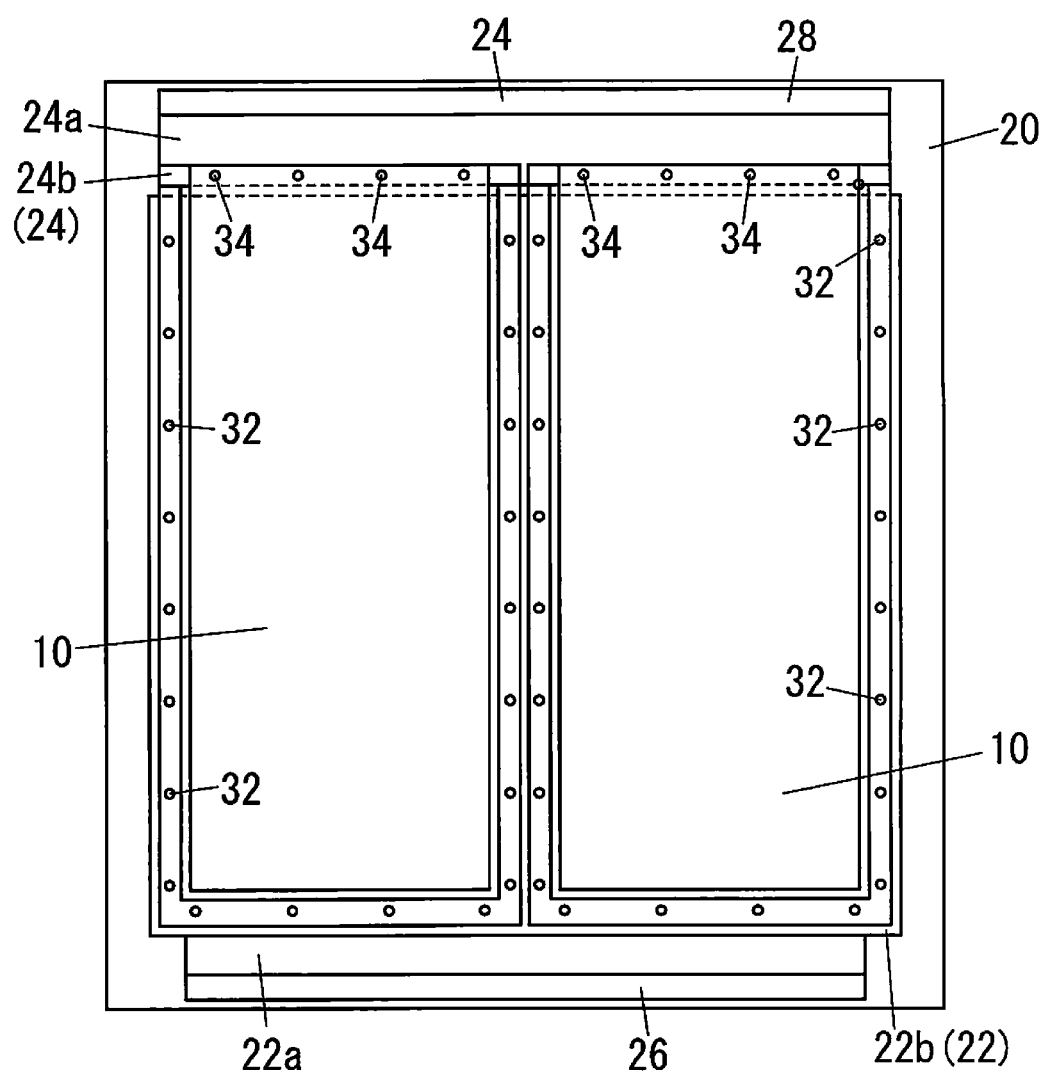
FIG. 4 is a schematic plan view of the light emission device of Embodiment 1 in a state in which a cover is detached therefrom.
Figure 6:
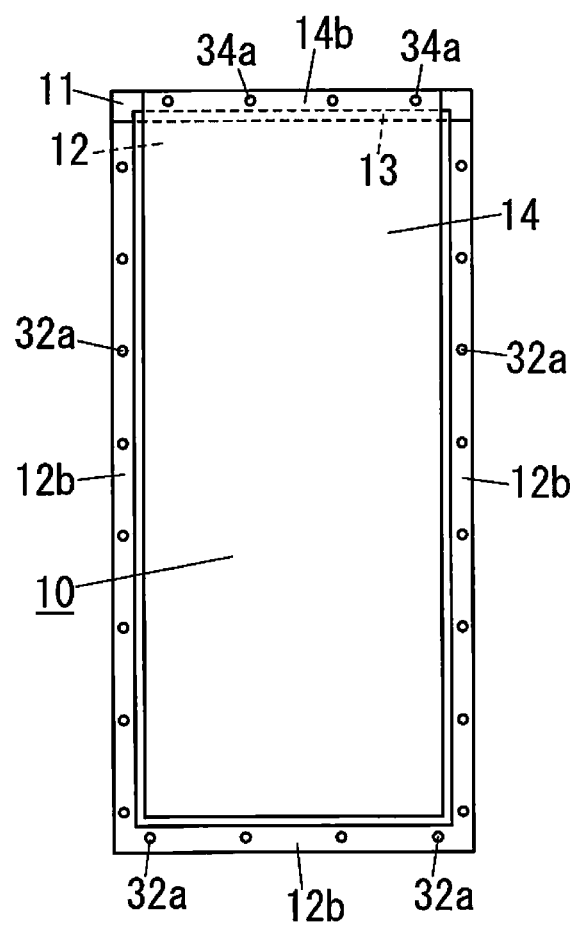
FIG. 6 is a schematic plan view of an organic electroluminescent element of the light emission device of Embodiment 1.
Figure 7:
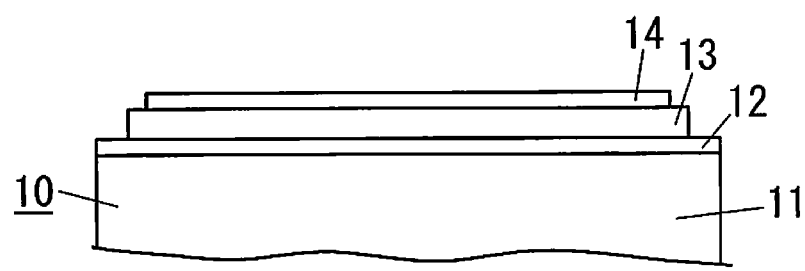
FIG. 7 is a schematic cross-sectional view of the organic electroluminescent element of the light emission device of Embodiment 1.
Figure 9A:
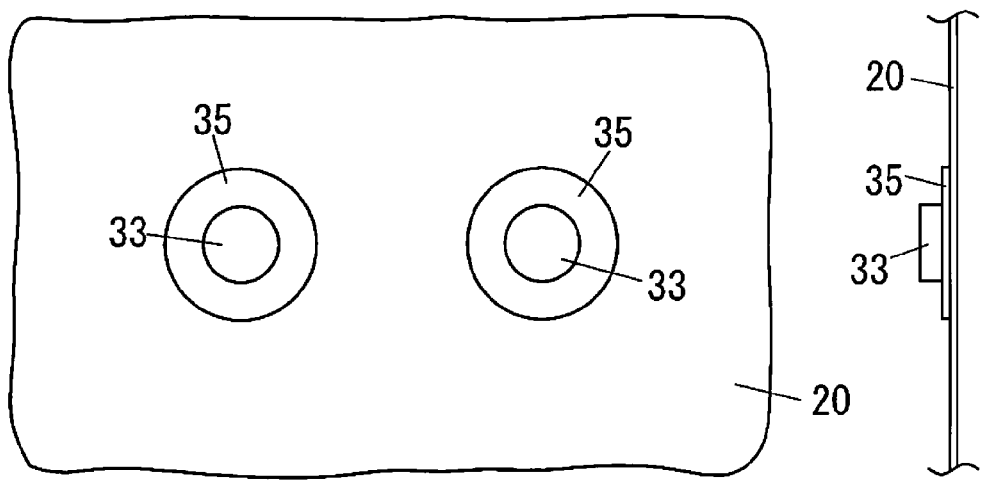
FIG. 9A is a schematic cross-sectional view of a first protrusion electrode and the vicinities thereof of the light emission device of Embodiment 1.
Figure 9C:
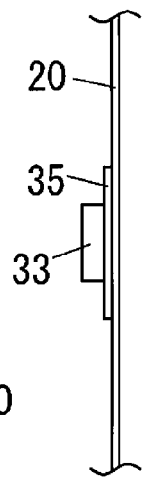
FIG. 9C is a side view of the first protrusion electrode and the vicinities thereof shown in FIG. 9A.
Figure 9B:
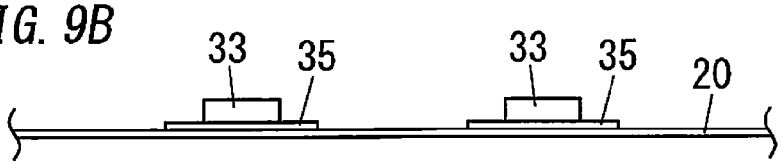
FIG. 9B is a bottom view of the first protrusion electrode and the vicinities thereof shown in FIG. 9A.

Hereinafter, a light emission device of the present embodiment will be described with reference to FIGS. 1 to 12.

A light emission device includes an organic electroluminescent element 10 in which a function layer 13 that includes at least a light-emitting layer is formed over a surface 1101 (first surface of first substrate 11) of a first substrate 11. Also, the light emission device includes a wiring board 20 in which a first patterned conductor 22 and a second patterned conductor 24 that are electrically connected respectively to a first electrode 12 and a second electrode 14 of the organic electroluminescent element 10 are provided on a surface 2101 (first surface of second substrate 21) of a second substrate 21. Here, the function layer 13 is provided so as to be present between a surface 1201 of the first electrode 12 (first surface of first electrode 12) and a surface 1402 of the second electrode 14 (second surface of second electrode 14). Further, the function layer 13 includes a bent portion with an L-shape serving as a separation portion 13A, and a surface $13A_1$ of the separation portion 13A (first surface of separation portion 13A) is in contact with the surface 1101 of the first substrate 11 (first surface of first substrate 11). The first electrode 12 and the second electrode 14 are thereby not electrically interconnected directly, and are interconnected via the function layer 13. The light emission device includes a first connection part 32 and a second connection part 34. The first connection part 32 is electrically connected to the first electrode 12 and the first patterned conductor 22, and the second connection part 34 is electrically connected to the second electrode 14 and the second patterned conductor 24.

In the light emission device, the first electrode 12 and the second electrode 14 include a first extended portion 12b and a second extended portion 14b, respectively. Each of the first extended portion 12b and the second extended portion 14b extends outside from sides of a light-emitting unit defined as an overlap of the first electrode 12, the functional layer 13, and the second electrode 14. The first extended portion 12b and the second extended portion 14b overlap the first patterned conductor 22 and the second patterned conductor 24, respectively. The organic electroluminescent element 10 includes a first through hole 15 which penetrates the first substrate 11 and the first extended portion 12b, and a second through hole 17 which penetrates the first substrate 11 and the second extended portion 14b. The first connection part 32 includes: a first through-hole wire 32a which is inside (on an inner periphery of) the first through hole 15 and has a hollow cylindrical shape; and a first protrusion electrode 32b which protrudes from the first patterned conductor 22 along a thickness direction of the light emission device to be inside the first through-hole wire 32a so as to be electrically connected to the first through-hole wire 32a. The second connection part 34 includes: a second through-hole wire 34a which is inside (on an inner periphery of) the second through hole 17 and has a hollow cylindrical shape; and a second protrusion electrode 34b which protrudes from the second patterned conductor 24 along the thickness direction of the light emission device to be inside the second through-hole wire 34a so as to be electrically connected to the second through-hole wire 34a.

Moreover, the light emission device preferably includes a cover 60 that cooperates with the wiring board 20 to house the organic electroluminescent element 10. In short, in the light emission device, the organic electroluminescent element 10 is preferably housed in an air-tight space 80 that is surrounded by the wiring board 20 and the cover 60.

Hereinafter, constituent elements of the light emission device will be described in detail.

The organic electroluminescent element 10 has a bottom emission type configuration in which light emitted from the light-emitting layer is radiated through a surface 1102 of the first substrate 11 (second surface of first substrate 11), but is not limited thereto and may have a top emission type configuration in which light emitted from the light-emitting layer is radiated in the opposite direction from a direction toward the surface 1102 of the first substrate 11 (second surface of first substrate 11) from the light-emitting layer.

The first substrate 11 has a rectangular shape in a planar view, but is not limited thereto and may have a round shape, a triangular shape, a pentagonal shape, a hexagonal shape, or the like.

The first substrate 11 may be a light transmissive plastic plate or a glass substrate. A material for the plastic plate is preferably a plastic material that has a large refractive index compared with a glass material such as an alkali-free glass and a soda-lime glass. This kind of plastic material, for example, may be polyethylene terephthalate (PET), polyethylene naphthalate (PEN), polyether sulfone (PES), polycarbonate (PC), or the like. Note that in a case where the organic electroluminescent element 10 has the top emission type configuration, the first substrate 11 may be formed of a non-transmissive material. Specifically, the first substrate 11 may be formed of a metal plate, or the like.

In a case where a glass substrate is used as the first substrate 11, unevenness of the surface 1101 of the first substrate 11 may cause a leak current or the like of the organic electroluminescent element 10 (deterioration of the organic electroluminescent element 10). Therefore, in the case where a glass substrate is used as the first substrate 11, the cost increases because a glass substrate for forming the element is required to be highly precisely polished so as to reduce the size of the surface roughness of the surface 1101. Note that, with regard to the surface roughness of the surface 1101 of the translucent first substrate 11, the arithmetic mean roughness Ra that is defined in JIS B 0601-2001 (ISO 4287-1997) is preferably several nanometers or less.

In contrast, when a plastic plate is used as the first substrate 11, a plate in which the arithmetic mean roughness Ra of the surface 1101 is less than several nanometers can be obtained at a low cost without specific high precision polishing.

The organic electroluminescent element 10 includes the function layer 13 present between the first surface 1201 of the first electrode 12 and the second surface 1402 of the second electrode 14. The function layer 13 includes a hole-transport layer, a light-emitting layer, an electron-transport layer, and an electron-injection layer which are arranged in this order from the first surface 1201 of the first electrode 12. In short, in the organic electroluminescent element 10, the first electrode 12 functions as an anode and the second electrode 14 functions as a cathode. Here, in the organic electroluminescent element 10, the first electrode 12 is present on the surface 1101 of the first substrate 11 (first surface of first substrate 11), and the second surface 1402 of the second electrode 14 faces the first surface 1201 of the first electrode 12, the second electrode 14 being disposed over an opposite side (a first surface 1101 side of the first electrode 12) of the first electrode 12 from the first substrate 11. Note that the organic electroluminescent element 10 may be configured such that the first electrode 12 functions as the cathode and the second electrode 14 functions the anode. In this case, the stacking order of the function layer 13 may be reversed.

In the organic electroluminescent element 10, the first electrode 12 is a transparent electrode and the second electrode 14 is a reflective electrode that reflects light from the light-emitting layer. The organic electroluminescent element 10 is thereby has the aforementioned bottom emission type configuration. Note that, when the first electrode 12 is a reflective electrode and the second electrode 14 is a transparent electrode, the organic electroluminescent element 10 has the aforementioned top emission type configuration.

The layered structure of the function layer 13 is not limited to the aforementioned example and may be, for example, a single-layer structure of the light-emitting layer, a stacked structure of the hole-transport layer, the light-emitting, and the electron-transport layer, a stacked structure of the hole-transport layer and the light-emitting layer, or a stacked structure of the light-emitting layer and the electron-transport layer. The hole-injection layer may be interposed between the anode and the hole-transport layer. The light-emitting layer may be a single-layer structure or a multi-layer structure. When the desired light emission color is white, for example, three kinds of dopant coloring matters for red, green, and blue may be doped in the light-emitting layer, a stacked structure may be adopted that is constituted by a hole transportable blue light-emitting layer, an electron transportable green light-emitting layer, and an electron transportable red light-emitting layer, or a stacked structure may be adopted that is constituted by an electron transportable blue light-emitting layer, an electron transportable green light-emitting layer, and an electron transportable red light-emitting layer. The function layer 13 emits light in response to application of a voltage between the first electrode 12 and the second electrode 14 which are on the opposite sides of the function layer 13. So, the function layer 13 itself may be used as a single light-emitting unit. Hence, a multiunit structure may be adopted in which a plurality of light-emitting units are stacked so as to be electrically interconnected in series while interlayers having light transparency and conductivity are interposed therebetween (that is, a structure in which a plurality of light-emitting units are stacked in the thickness direction between one first electrode 12 and one second electrode 14).

The anode is an electrode for injecting holes into the light-emitting layer, and preferred examples of material for the anode include an electrode material with a large work function such as metal, an alloy, an electrically-conductive compound, and a mixture of these materials. It is preferable to use material with a work function of 4 eV to 6 eV inclusive for the anode so that the difference from the HOMO (Highest Occupied Molecular Orbital) level is not too large. When the light emission device is designed to emit light through the anode, examples of an electrode material for the anode, include ITO, tin oxide, zinc oxide, IZO, copper iodide, an electrically-conductive polymer such as PEDOT and polyaniline, an electrically-conductive polymer that is doped with an arbitrary acceptor, and an electrically conductive optical transparent material such as a carbon nanotube. Here, the anode may be formed into a thin film on the aforementioned surface of the first substrate 11 by a sputtering method, a vacuum vapor deposition method, a coating method, or the like.

Note that the sheet resistance of the anode is preferably several hundred Ω/sq or less, and is more preferably 100 Ω/sq or less. Here the thickness of the anode is selected in accordance with the light transmissivity, the sheet resistance, and the like of the anode, but may be set to 500 nm or less, and preferably in a range from 10 nm to 200 nm.

The cathode is an electrode for injecting electrons into the light-emitting layer, and preferred examples of material for the cathode include an electrode material such as metal, an alloy, an electrically-conductive compound with a small work function, and a mixture of these materials. A material with a work function of 1.9 eV to 5 eV inclusive is preferably used so that the difference from the LUMO (Lowest Unoccupied Molecular Orbital) level is not too large. Examples of the electrode material for the cathode include aluminum, silver, magnesium, and an alloy of these metals with another metal such as a magnesium-silver mixture, a magnesium-indium mixture, and an aluminum-lithium alloy. Similarly, available are a metal conductive material, a metal oxide, a mixture of these materials with another metal, and a stacked film in which a ultrathin film made of aluminum oxide (here, a thin film with a thickness of 1 nm or less such that electrons flow therethrough by tunnel injection) and an aluminum thin film. When the light emission device is designed to emit light through the cathode, as an electrode material for the cathode, ITO, IZO, or the like, for example, may be adopted.

As the material of the light-emitting layer, any material that is known as a material for that of organic electroluminescent elements may be used. Examples of the material for the light-emitting layer include anthracene, naphthalene, pyrene, tetracene, coronene, perylene, phthaloperylene, naphthaloperylene, diphenylbutadiene, tetraphenylbutadiene, coumalin, oxadiazole, bisbenzooxazoline, bisstyryl, cyclopentadiene, a quinoline metal complex, a tris(8-hydroxyquinolinate) aluminum complex, a tris(4-methyl-8-quinolinato) aluminum complex, a tris(5-phenyl-8-quinolinato) aluminum complex, an aminoquinoline metal complex, a benzoquinoline metal complex, tri-(p-terphenyl-4-yl)amine, a 1-aryl-2,5-di(2-thienyl)pyrrole derivative, pyran, quinacridone, rubrene, a distyrylbenzene derivative, a distyrylarylene derivative, a distyrylamine derivative, various fluorochromes, the above-mentioned compound-based material or derivatives of the above materials. However, the material for the light-emitting layer is not limited thereto. Furthermore, preferred examples of the material for the light-emitting layer include a mixture of light-emission materials selected from these compounds appropriately. Similarly, not only compounds that generate fluorescence represented by the above compounds, but also materials such as materials that generate light-emission from a multiplet spin state such as a phosphorescent light-emission material that generates phosphorescence and compounds whose molecule includes these materials as a portion may be preferably used. A light-emitting layer made of at least one of these materials may be formed by a dry process such as a vapor deposition method and a transfer method, or may be formed by a wet process such as a spin coat method, a spray coating method, a dye coating method, or a gravure printing method.

Examples of material for the aforementioned hole-injection layer include: a hole injecting organic material; a metal oxide; and an organic material and inorganic material used as material for an acceptor. The hole injecting organic material is a material that has hole transportability, a work function of around 5.0 to 6.0 eV, and strong adherence to the anode, for example, and is CuPc, starburst amine, or the like. A hole-injection metal oxide is, for example, a metal oxide that includes any one of molybdenum, rhenium, tungsten, vanadium, zinc, indium, tin, gallium, titanium, and aluminum. In addition to an oxide containing a single metal, it may be a composite metal oxide that contains a set of metals (e.g., a set of indium and tin, a set of indium and zinc, a set of aluminum and gallium, a set of gallium and zinc, and a set of titanium and niobium). The hole-injection layer made of at least one of these materials may be formed by a dry process such as a vapor deposition method, a transfer method, or may be formed by a wet process such as a spin coat method, a spray coating method, a dye coating method, or a gravure printing method.

A material for the hole-transport layer may be selected from compounds with hole transportability. Examples of the compounds with hole transportability include arylamine compounds (e.g., 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4''-tris(N-(3-methylphenyl)N-phenylamino)triphenylamine (MTDATA), 4,4'-N,N'-dicarbazolebiphenyl (CBP), spiro-NPD, spiro-TPD, spiro-TAD, and TNB), an amine compound that contains a carbazole group, and an amine compound that contains a fluorene derivative. However, an arbitrary hole-transport material that is generally known can be used.

A material for the electron-transport layer may be selected from compounds with electron transportability. Examples of the compounds with electron transportability include a metal complex that is known as an electron transportable material (e.g., $Alq_3$), and a heterocyclic compound (e.g., a phenanthroline derivative, a pyridine derivative, a tetrazine derivative, or an oxadiazole derivative). However, an arbitrary electron transport material that is generally known can be used.

A material for the electron-injection layer may be arbitrarily selected from following compounds: metal halides such as a metal fluoride (e.g., lithium fluoride and magnesium fluoride) and a metal chloride (e.g., sodium chloride and magnesium chloride); metal oxide; metal nitride; metal carbide; metal oxynitride; a carbon compound; and a silicon compound (e.g., $SiO_2$ and SiO). Examples of metal for the metal oxide, the metal nitride, the metal carbide, and the metal oxynitride include aluminum, cobalt, zirconium, titanium, vanadium, niobium, chromium, tantalum, tungsten, manganese, molybdenum, ruthenium, iron, nickel, copper, gallium, zinc, and silicon. More specific examples of the metal oxide, the metal nitride, the metal carbide, and the metal oxynitride include a compound to serve as an insulator such as aluminum oxide, magnesium oxide, iron oxide, aluminum nitride, silicon nitride, silicon carbide, silicon oxynitride, and boron nitride. These materials can be formed into a thin film by a vacuum vapor deposition method or a sputtering method.

The organic electroluminescent element 10 is disposed over the wiring board 20 such that the first extended portion 12b and the second extended portion 14b overlap the first patterned conductor 22 and the second patterned conductor 24, respectively.

When the organic electroluminescent element 10 is designed to produce light in the functional layer 13 and emit the light outside through the first substrate 11, it is preferable to provide a light outcoupling structure 50 to suppress reflection of light emitted from the light emitting layer on an opposite surface of the first substrate 11 (second surface 1102 of first substrate 11) from the first electrode 12.

The light emission device is configured such that the light emitted from the light-emitting layer of the organic electroluminescent element 10 is emitted outside through the wiring board 20. In this regard, the light outcoupling structure 50 is constituted by an uneven structure portion 51 that is provided on the opposite surface of the first substrate 11 (second surface of first substrate 11) from the first electrode 12, and a space 70 is present between the uneven structure portion 51 and the wiring board 20. Therefore, in the light emission device, it is possible to reduce loss of light by suppressing reflection of light that is emitted from the light emitting layer and reaches the wiring board 20 can be reduced and the light outcoupling efficiency can be improved. Note that the light emission device may be configured such that the light emitted from the light-emitting layer of the organic electroluminescent element 10 is extracted through the cover 60.

Refractive indices of the light-emitting layer and the first substrate 11 in the organic electroluminescent element 10 are larger than the refractive index of a gas such as air. Therefore, when the aforementioned light outcoupling structure 50 is not provided but the space between the first substrate 11 and the wiring board 20 is just filled with air, total reflection occurs at an interface between a first medium constituted by the first substrate 11 and a second medium constituted by the air, that is, light that strikes the interface at an angle equal to or above the total reflection angle is reflected. Since the light reflected at the interface between the first medium and the second medium is reflected multiple times inside the function layer 13 or the first substrate 11 and attenuates without being extracted outside, the light outcoupling efficiency decreases. Similarly, light that enters the interface between the first medium and the second medium at an angle less than the total reflection angle suffers Fresnel reflection, and as a result the light outcoupling efficiency decreases more.

In contrast, since the light emission device is provided with the light outcoupling structure 50 to the organic electroluminescent element 10, the light outcoupling efficiency to the outside of the organic electroluminescent element 10 can be improved.

The uneven structure portion 51 has a two-dimensional periodic structure. Here, when the wavelength of light that is emitted from the light-emitting layer is in a range of 300 nm to 800 nm, the period of the two-dimensional periodic structure of the uneven structure portion 51 is preferably set appropriately in a range between ¼ times and 10 times the wavelength $\lambda$ wherein $\lambda$ (value obtained by dividing the wavelength in vacuum by a refractive index of the medium) represents the wavelength of light in the medium.

When the period is set in, for example, a range between $5\lambda$ and $10\lambda$, the light outcoupling efficiency is improved owing to a geometrical-optical effect, that is, an increase in the area of the surface where the incidence angle is less than the total reflection angle. When the period is set, for example, in a range between $\lambda$ and $5\lambda$, the light outcoupling efficiency is improved owing to the function of extracting light having the incident angle equal to the total reflection angle or more as diffracted light. When the period is set, for example, in a range between $\lambda/4$ and $\lambda$, an effective refractive index in a vicinity of the uneven structure portion 51 decreases gradually as the distance from the first electrode 12 increases. This is equivalent to a thin film layer having a refractive index between the refractive index of the medium of the uneven structure portion 51 and the refractive index of the medium of the space 70 being interposed between the first substrate 11 and the space 70, and as a result Fresnel reflection can be reduced. In short, if the period is set in a range between $\lambda/4$ and $10\lambda$, reflection (total reflection or Fresnel reflection) can be suppressed, and it is possible to improve the light outcoupling efficiency of the organic electroluminescent element 10. However, in order to improve a light outcoupling efficiency by a geometrical-optical effect, the period may have an upper limit of $1000\lambda$. The uneven structure portion 51 is not required to have a periodic structure such as a two-dimensional periodic structure. The light outcoupling efficiency can be improved even with an uneven structure in which sizes of the unevenness vary randomly or with an uneven structure that does not have periodicity. Note that, when uneven structures with different uneven sizes coexist (an uneven structure with a period of $1\lambda$ and an uneven structure with a period of $5\lambda$ or more coexist, for example), an uneven structure having the largest occupancy in the uneven structure portion 51 among the uneven structures provides the light outcoupling efficiency dominantly.

The uneven structure portion 51 of the light outcoupling structure 50 is constituted by a prism sheet (light diffusion film such as LIGHT-UP (registered trademark) GM3 by Kimoto Co., Ltd., for example), but is not limited thereto. For example, the uneven structure portion 51 may be formed by an imprint method (nanoimprint method) on the first substrate 11. The first substrate 11 may be formed by an injection molding to directly form the uneven structure portion 51 on the surface 1101 of the first substrate 11 (second surface of first substrate 11) using an appropriate metal mold. Usually, material used for the above-described prism sheet is often a resin with a refractive index of about 1.4 to 1.6 (that is, a general resin whose refractive index is close to the refractive index of a glass substrate), and is not a resin with a high refractive index whose refractive index is higher than that of a general resin. Therefore, when a plastic plate whose refractive index is higher than that of a glass substrate is used as the first substrate 11 and the refractive index of the uneven structure portion 51 is lower than the refractive index of the first substrate 11, the total reflection occurs at the interface between the first substrate 11 and the uneven structure portion 51 (refractive index interface), and as a result a light outcoupling loss occurs. In view of this, in the light emission device, when a plastic plate whose refractive index is higher than that of a glass substrate is used as the first substrate 11, due to using a material whose refractive index is equal to or higher than the refractive index of the first substrate 11 for the uneven structure portion 51 (the refractive index of a material of the uneven structure portion 51 is not lower than the refractive index of the first substrate 11), total reflection at the interface between the first substrate 11 and the uneven structure portion 51 can be prevented and the light outcoupling efficiency can be improved.

With regard to the light outcoupling structure portion 50, it is important that the space 70 is present between the surface of the uneven structure portion 51 and the wiring board 20. Supposing that the surface of the uneven structure portion 51 serves as the interface between the uneven structure portion 51 and the wiring board 20, since a refractive index interface between the wiring board 20 and an external air is present, the total reflection occurs again at the refractive index interface. In contrast, in the light emission device, since light from the organic electroluminescent element 10 can initially be extracted to the space 70, occurrence of the total reflection loss at the interface between the air in the space 70 and the wiring board 20 and at the interface between the wiring board 20 and the external air can be suppressed.

The light emission device of the present embodiment includes two organic electroluminescent elements 10 in the air-tight space 80 that is surrounded by the wiring board 20 and the cover 60. These two organic electroluminescent elements 10 are arranged side by side on a plane parallel to the aforementioned surface 2101 of the second substrate 21 (first surface of second substrate 21) in the wiring board 20. The organic electroluminescent elements 10 each have a rectangular shape in a planar view and have the same outer shape size. In the light emission device, the two organic electroluminescent elements 10 are arranged side by side in the width direction (lateral direction X) of the organic electroluminescent element 10. Note that the two organic electroluminescent elements 10 have the same structure, in addition to the outer shape size. In short, the two organic electroluminescent elements 10 have the same specifications.

In the organic electroluminescent element 10, the plan view shape of the first substrate 11 is a rectangle as shown in FIG. 8A. The plan view of the first electrode 12 is a rectangular shape as shown in FIG. 8B while only an end portion 11A in the lengthwise direction (longitudinal direction) Y of the first substrate 11 (first end portion of first substrate 11 in longitudinal direction Y) is exposed. Therefore, the dimension of the first electrode 12 in the width direction (lateral direction X) is the same as the dimension in the width direction (lateral direction X) of the first substrate 11, and a dimension of the first electrode 12 in the lengthwise direction (longitudinal direction Y) is shorter than the dimension in the lengthwise direction (longitudinal direction Y) of the first substrate 11.

Moreover, in the organic electroluminescent element 10, the plan view shape of the function layer 13 is a rectangle as shown in FIG. 8C whose dimensions in the lengthwise direction (longitudinal direction Y) and in the width direction (lateral direction X) are smaller than the corresponding dimensions of the first substrate 11.

Moreover, in the organic electroluminescent element 10, the shape of the second electrode 14 in a planar view is a rectangle as shown in FIG. 8D whose dimension in the width direction (lateral direction X) is smaller than the dimension of the function layer 13 in the width direction and dimension in the lengthwise direction (longitudinal direction Y) is smaller than the dimension of the first substrate 11 in the lengthwise direction (longitudinal direction Y). Here, the second electrode 14 is disposed such that an end portion $14b_1$ thereof in the lengthwise direction (longitudinal direction Y) is formed on the end portion 11A of the first substrate 11.

The dimension of the second electrode 14 in the lengthwise direction (longitudinal direction Y) is set such that the end portion $14b_1$ of the second electrode 14 in the lengthwise direction (longitudinal direction Y) overlap an end portion 13A (first end portion of function layer 13 in longitudinal direction Y) of the function layer 13 in the lengthwise direction (longitudinal direction Y), and that a portion 12b of the first electrode 12 formed on an end portion (second end portion 11B of the first substrate 11 in longitudinal direction Y) of the first substrate 11 in the lengthwise direction (longitudinal direction Y) and an end portion (second end portion 13B of the function layer 13 in longitudinal direction Y) of the function layer 13 in the lengthwise direction (longitudinal direction Y) are exposed. Accordingly, in the first electrode 12, the portion 12b formed on the end portion (second end portion 11B of first substrate 11 in longitudinal direction Y) of the first substrate 11 in the lengthwise direction (longitudinal direction) Y and the portions 12b formed on the both end portions of the first substrate 11 in the width direction (lateral direction X) are exposed, and these exposed portions 12b serve as the aforementioned first extended portions 12b. Similarly, in the second electrode 14, a portion 14b formed on the end portion (first end portion 11A of first substrate 11 in longitudinal direction Y) of the first substrate 11 in the lengthwise direction (longitudinal direction Y) serves as the aforementioned second extended portion 14b. The organic electroluminescent element 10 has a line-symmetrical shape with respect to the center line along the lengthwise direction (longitudinal direction) Y in a planar view. That is to say, the organic electroluminescent element 10 has a right-left symmetrical shape assuming that the width direction (lateral direction) X is the right-left direction.

In the organic electroluminescent element 10, the first extended portion 12b and the second extended portion 14b are on a periphery of the surface 1101 of the first substrate 11 that has a rectangular shape in a planar view. The first extended portion 12b extends along three sides of the first substrate 11, and the second extended portion 14b extends along the remaining one side of the first substrate 11. Here, in the organic electroluminescent element 10, it is preferable that the first electrode 12 is formed of a transparent conductive oxide (Transparent conducting Oxide: TCO) such as ITO, and the second electrode 14 is formed of a metal that has a sufficiently small sheet resistance compared with the first electrode 12 and has high reflectivity to the light from the light-emitting layer. The first electrode 12 made of the transparent conductive oxide preferably has a sheet resistance of 30 Ω/sq or less, and preferably has a higher transmissivity for the light generated in the light-emitting layer. For example, the transparent conductive oxide may be selected from ITO, AZO, GZO, IZO, and the like. In the organic electroluminescent element 10 in which both of the first electrode 12 and the second electrode 14 are made of transparent conductive oxide, the light emission device can emit light outside from each of the both sides orthogonal to the thickness direction of the light emission device.

Note that, in the organic electroluminescent element 10, thicknesses of the first substrate 11, the first electrode 12, the function layer 13, and the second electrode 14 are set to fall in a range of 50 µm to 100 µm, a range of 100 to 150 nm, 200 to 400 nm, and 100 nm to 150 nm, respectively, but these values are only examples and are not specifically limited thereto.

It is preferable that a ratio of the dimension of the first substrate 11 in the lengthwise direction (longitudinal direction Y) in a planar view to the dimension thereof in the width direction (lateral direction X) is 2 or more. Accordingly, in the organic electroluminescent element 10, it is possible to improve in-plane uniformity in a density of current which flows through the light-emitting layer, and therefore it is possible to suppress an in-plane variation of luminance. Note the substrate 11 has the dimension in the lengthwise direction of 82 mm and the dimension in the width direction of 39 mm, however, these values are examples, and the dimensions of the first substrate 11 are not limited to the values.

As described above, the first patterned conductor 22 and the second patterned conductor 24 are formed on the surface 2101 of the second substrate 21 of the wiring board 20. When the light emission device is designed to emit light from the organic electroluminescent element 10 through the cover 60, the second substrate 21 may be a relatively low-priced glass substrate such as a super white glass.

The wiring board 20 has the second substrate 21 with a rectangular shape in a planar view. The first patterned conductor 22 is formed into a shape corresponding to projections of the first extended portions 12b of a plurality of (here, two of) the aforementioned organic electroluminescent elements 10. In other words, the first extended portions 12b are arranged so as to face the first patterned conductor 22 on the wiring board 20 in the thickness direction. Similarly, the second patterned conductor 24 is formed in a shape corresponding to projections of the second extended portions 14b of the plurality of (here, two of) the aforementioned organic electroluminescent elements 10. In other words, the second extended portions 14b are arranged so as to face the second patterned conductor 24 on the wiring board 20 in the thickness direction.

Here, regarding the wiring board 20, the first patterned conductor 22 has an E-shape in a planar view, and the second patterned conductor 24 has an I-shape in a planar view. With regard to the wiring board 20, the first patterned conductor 22 includes a portion extending along three sides of the second substrate 21, and the second patterned conductor 24 extends along the remaining side of the second substrate 21. Since the first patterned conductor 22 has an E-shape in a planar view as described above, the first patterned conductor 22 has an additional portion that is disposed so as to face adjacent portions of the first extended portions 12b of the two neighboring organic electroluminescent elements 10. Note that the shortest distance between the first patterned conductor 22 and the second patterned conductor 24 is determined to keep a predetermined distance for insulation. Shapes of the first patterned conductor 22 and the second patterned conductor 24 in a planar view are not specifically limited, and may be set appropriately depending on the shape and the number of the organic electroluminescent elements 10. In a case where n (n≥3) organic electroluminescent elements 10 are arranged in the width direction (lateral direction X) of the organic electroluminescent element 10 side by side, for example, a comb shape with (n+1) comb teeth may be adopted.

In any case, the first patterned conductor 22 and the second patterned conductor 24 are formed so as not to overlap a projection of the aforementioned light emission portion of the organic electroluminescent element 10 on the second substrate 21.

The first patterned conductor 22 has an exposed portion which is not covered by the cover 60 and is used as a first external interconnection electrode 26, and the second patterned conductor 24 has an exposed portion which is not covered by the cover 60 and is used as a second external interconnection electrode 28. Here, the first external interconnection electrode 26 and the second external interconnection electrode 28 are arranged so as to face each other in a planar view. The first external interconnection electrode 26 and the second external interconnection electrode 28 are each formed in a band shape.

In the light emission device, the first external interconnection electrode 26 and the second external interconnection electrode 28 are exposed outside of a package that is configured by the wiring board 20 and the cover 60. The light emission device thereby has a structure in which power can be supplied from the outside via the first external interconnection electrode 26 and the second external interconnection electrode 28. Note that the second substrate 21 of the wiring board 20 has the thickness of 1 mm and the plane size of 100 mm by 100 mm (the dimension along the longitudinal direction Y by the dimension along the lateral direction X), but these values are only examples and are not specifically limited. The width of a portion of the first patterned conductor 22 that is formed along two parallel sides of the second substrate 21 is set to be 1 to 2 mm, but this value is an example and is not specifically limited.

The first patterned conductor 22 has a layered structure where a second conduction layer 22b is disposed on a first conduction layer 22a, and the second patterned conductor 24 has a layered structure where a second conduction layer 24b is disposed on a first conduction layer 24a. Here, as a material for the first conduction layers 22a and 24a, a transparent conductive oxide such as ITO is preferably adopted. The first conduction layers 22a and 24a may be formed by a sputtering method, for example. When the second conduction layers 22b and 24b are formed by plating, as a material for the second conduction layers 22b and 24b, an electrically conductive material such as PdNiAu is preferably adopted. When the second conduction layers 22b and 24b are formed by a sputtering method, as a material for the second conduction layers 22b and 24b, an electrically conductive material such as MoAl, CrAg, and AgPdCu (APC) is preferably adopted. When the second conduction layers 22b and 24b are formed by a printing method, as a material for the second conduction layers 22b and 24b, an electrically conductive material such as a silver paste (such as QMI516E by Henkel A G & Co. KGaA) may be adopted.

The first patterned conductor 22 and the second patterned conductor 24 are not limited to have these layered structures, and may be a single-layer structure that includes a corresponding one of the aforementioned second conduction layers 22b and 24b, or a layer structure constituted by three layers or more.

The wiring board 20 may be formed by preparing the second substrate 21 separately from the first patterned conductor 22 and the second patterned conductor 24 and bonding the first patterned conductor 22 and the second patterned conductor 24 to the second substrate 21.

The aforementioned first through hole 15 and second through hole 17 extend through the organic electroluminescent element 10 in a thickness direction of the organic electroluminescent element 10. Apertures of the first through hole 15 and the second through hole 17 have circular shapes. Thus, the hollow cylindrical first and second through-hole wires 32a and 32b of the respective first and second connection parts 32 and 34 have circular and hollow cylindrical shapes. Therefore, the first through-hole wire 32a and the second through-hole wire 34a each have apertures with circular shapes. The first through hole 15 and the second through hole 17 may be formed by laser processing, punching processing, or the like. Note that the shape of the aperture of each of the first through hole 15 and the second through hole 17 is not particularly limited. In addition, the shape of the aperture of each of the first through-hole wire 32a and the second through-hole wire 34a is not particularly limited.

Each of the first through-hole wire 32a and the second through-hole wire 34a is a penetrating electrode 36 with a hollow cylindrical shape formed by sputtering, plating, or the like.

The first connection part 32 includes the first through-hole wire 32a and the first protrusion electrode 32b as described above. The second connection part 34 includes the second through-hole wire 34a and the second protrusion electrode 34b as described above. Each of the first protrusion electrode 32b and the second protrusion electrode 34b is a protrusion electrode 33 (see, FIGS. 9A, 9B, and 10) with a pillar shape (cylindrical shape in the drawings). Note that the shape of the protrusion electrode 33 is preferably circular cylindrical shape, but is not limited to this, and may be rectangular cylindrical shape.

A preferred material for the first protrusion electrode 32b has a good adhesiveness to the first patterned conductor 22, and a preferred material for the second protrusion electrode 34b is a metal that has a good adhesiveness to the second patterned conductor 24. Further, each of these preferred materials have a high mechanical strength, and a high conductivity. For example, these preferred materials are selected from copper, aluminum, and nickel.

Figure 10:
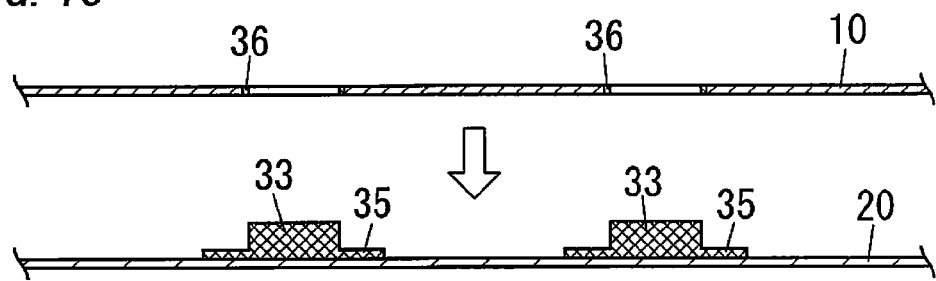
FIG. 10 is an explanatory drawing of a manufacturing method of the light emission device of Embodiment 1.

In a process of electrically connecting the organic electroluminescent element 10 to the wiring board 20, for example, first, the wiring board 20 and the organic electroluminescent element 10 are disposed so as to face each other as shown in FIG. 10. Thereafter, to insert the protrusion electrodes 33 into the penetrating electrodes 36 individually, the organic electroluminescent element 10 is moved along such a direction (indicated by an arrow in FIG. 10) that the organic electroluminescent element 10 comes close to the wiring board 20.

The first protrusion electrode 32b of the first connection part 32 and the second protrusion electrode 34b of the second connection part 34 may be bonded to the first extended portion 12b and the second extended portion 14b by use of electrically conductive pastes (e.g., silver pastes) over the surface 1101 of the first substrate 11, respectively. Accordingly, it is possible to improve reliability of the electrical connection to the first connection part 32 and to the second connection part 34. In this case, with regard to each of the first connection part 32 and the second connection part 34, the electrically conductive paste is cured and baked, thereby forming a conductor containing a metal powder and an organic binder.

The light emission device of the present embodiment preferably includes the spacer 35 to keep the second substrate 21 and the organic electroluminescent element 10 separated by a distance from each other. A peripheral shape of the spacer 35 is a circular shape, but is not limited to such a circular shape and may be a polygonal shape. In this regard, in the light emission device, it is preferable that each of the first protrusion electrode 32b and the second protrusion electrode 34b is integral with the spacer 35. In this case, it is possible to reduce the number of parts constituting the light emission device and to facilitate the assembly of the light emission device.

The protrusion electrode 33 integral with the spacer 35 may be formed by trimming a bar so as to taper the bar. The bar has the same outer diameter as that of the spacer 35 and is made of the same material as that of the protrusion electrode 33. Alternatively, the protrusion electrode 33 integral with the spacer 35 may be formed by shaping the bar with pressing. When the bar is made of a good malleable metal such as copper and aluminum, using the press shaping method can reduce the production cost.

Figure 11A:
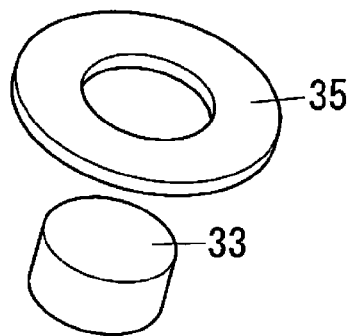
FIGS. 11A and 11B are schematic exploded perspective views of the first protrusion electrode of the light emission device of Embodiment 1.
Figure 11B:
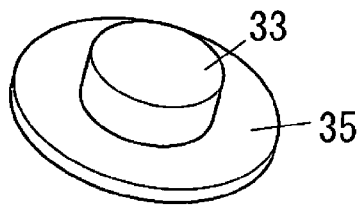
Figure 12:
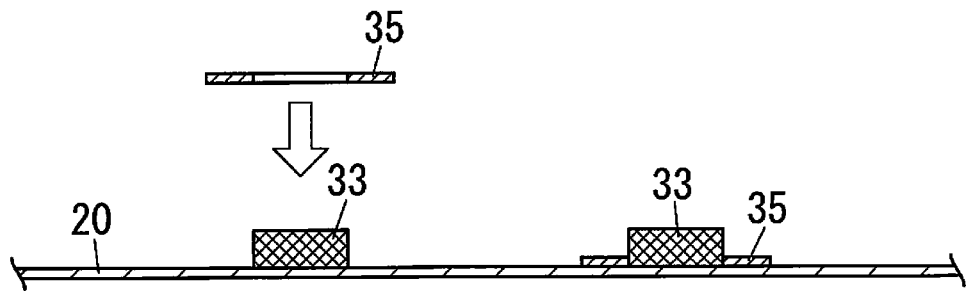
FIG. 12 is an explanatory drawing of a manufacturing method of the first protrusion electrode of the light emission device of Embodiment 1.

The spacer 35 may be a separate part from the protrusion electrode 33 as shown in FIGS. 11A, 11B, and 12, and the protrusion electrode 33 may be inserted in the spacer 35. In this case, the spacer 35 may be a washer-like member. Note that an arrow shown in FIG. 12 indicates a direction of a movement of the spacer 35 to insert the protrusion electrode 33 into the spacer 35.

When the spacer 35 is a separate part from the first protrusion electrode 32b and the second protrusion electrode 34b, the spacer 35 may be made of stainless steel, phosphor bronze, or the like.

The spacer 35 may be made of plastic or rubber.

In the light emission device, the first substrate 11 has the thickness of 0.1 mm, and each of the first through-hole wire 32a and the second through-hole wire 34a has the inner diameter of 1 mm, each of the first protrusion electrode 32b and the second protrusion electrode 34b has the height of 0.4 mm and the outer diameter of 1 mm, and the spacer 35 has the outer diameter of 2 mm. However, these values are only exemplified, and do not limit the light emission device, particularly.

Each of an interval between the first protrusion electrodes 32b and an interval between the second protrusion electrodes 34b is preferably 10 mm or less. Accordingly, the light emission device can prevent a warp of the organic electroluminescent element 10, and can reduce an electrical resistance between the first patterned conductor 22 and the second patterned conductor 24 and an electrical resistance between the first electrode 12 and the second electrode 14. Hence, the light emission device can have the improved efficiency.

The cover 60 includes a cover main portion 61 having a plate shape (here, a rectangular plate shape) and a frame portion 62 having a frame shape (here, a rectangular frame shape), which are formed integrally with each other. The cover 60 may be a single glass substrate provided with a recess in its surface, for example.

The cover 60 is bonded to the wiring board 20 with a bond (not shown). Here, the entire periphery of the frame portion 62 of the cover 60 is bonded to the wiring board 20. The cover main portion 61 may be a non-alkali glass substrate, but is not limited thereto and may be a soda-lime glass substrate, for example. The frame portion 62 is formed by shaping a non-alkali glass substrate. Alternatively, the frame portion 62 may be formed by shaping a soda-lime glass substrate.

A material for the bond is a fritted glass, but is not limited thereto and may be an epoxy resin, an acrylic resin, or the like. The light emission device including the bond made of the fritted glass can have an improved humidity resistance and can prevent a leakage of gas via the bond, and as a result long-time reliability can be improved. When the bond is formed of a resin material such as a thermosetting resin, a sealing margin of 3 mm or more is preferably provided to ensure airtightness. When the bond is formed of the fritted glass, airtightness can be ensured even with a sealing margin of about 1 mm. Accordingly, the light emission device including the bond made of the fritted glass can have a reduced area of a non-light-emission portion, compared with the case where a resin material is adopted.

However, on the aforementioned surface (first surface 2101 of second substrate 21) of the wiring board 20, the first patterned conductor 22 and the second patterned conductor 24 are provided that are electrically connected to the first electrode 12 and the second electrode 14, respectively, of the organic electroluminescent element 10. The cover 60 thereby has a portion that is connected to a portion of the periphery of the second substrate 21, a portion that is connected to a portion of the first patterned conductor 22, and a portion that is connected to a portion of the second patterned conductor 24. Here, from the viewpoint of connectivity with the aforementioned bond, the first conduction layers 22a and 24a of the first patterned conductor 22 and the second patterned conductor 24 have rooms for bonding and the rooms are exposed from the second conduction layers 22b and 24b, respectively. In the light emission device, the first conduction layers 22a and 24a are made of a transparent conductive oxide having higher affinity with the material for the bond such as fritted glass than metal has, and are connected to the bond. Therefore, connection strength can be improved. Hence, in the light emission device, airtightness of the package that is configured by the wiring board 20 and the cover 60 can be improved.

Here, in a case where the light emission device has a structure in which light that is radiated from the organic electroluminescent element 10 is emitted through the cover main portion 61, the cover 60 including the integral set of the cover main portion 61 and the frame portion 62 may be formed by a method of making a recess by a sandblast machining and thereafter polishing with a fluorine acid. However, in this case, it takes longer to form the cover 60 and results in cost increase.

Figure 13:
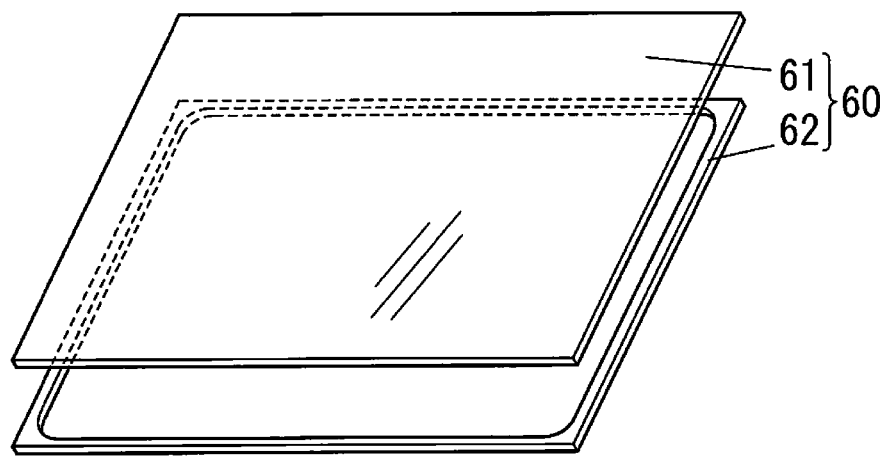
FIG. 13 is an exploded perspective view of another exemplary configuration of the cover in the light emission device of Embodiment 1.

As shown in FIG. 13, the cover 60 includes the cover main portion 61 with a plate shape (here, rectangular plate shape) and the frame portion 62 with a frame shape to be placed between a periphery of the cover main portion 61 and a periphery of the wiring board 20. The cover main portion 61 and the frame portion 62 may be separate parts, and the cover main portion 61 may be bonded to the cover main portion 61. The cover main portion 61 may be a non-alkali glass substrate, but is not limited thereto and may be a plate shape soda-lime glass substrate, for example. The frame portion 62 may be a non-alkali glass substrate processed appropriately, but is not limited thereto and may be a soda-lime glass substrate processed appropriately. The cover main portion 61 and the frame portion 62 may be bonded with using, for example, fritted glass, epoxy resin, acryl resin, or the like. However, in view of improving humidity resistance and reducing outgassing, fritted glass is preferably used for bonding.

The frame shaped frame portion 62 is formed by, for example, shaping a glass substrate that is different from that of the cover main portion 61 by a sandblast machining or a punching machining. Alternatively, the frame portion 62 may be formed by putting a molten glass into a mold, or may be formed by melting a formed glass frit, or may be formed by bending a glass fiber into a frame shape and butting and fusion-connecting both edges thereof.

Figure 14:
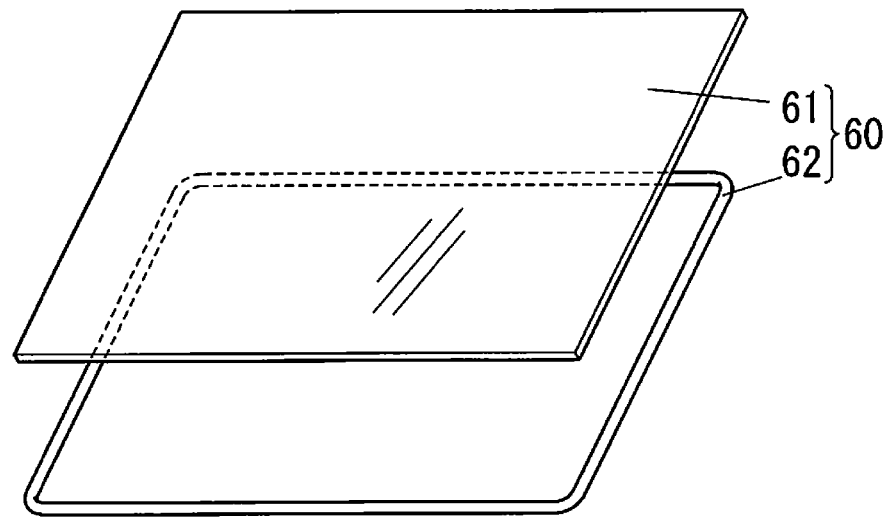
FIG. 14 is an exploded perspective view of another exemplary configuration of the cover in the light emission device of Embodiment 1.

The cover 60 may be formed by, as shown in FIG. 14, bonding the cover main portion 61 formed of a glass substrate and the frame shaped frame portion 62 such as a metal ring with a glass frit or the like. The metal ring is preferably made of Kovar whose thermal expansion coefficient is close to the thermal expansion coefficient of the cover main portion 61 and the second substrate 21, but material for the metal ring is not limited to Kovar and a desired alloy may be used, for example. Kovar is an alloy in which nickel and cobalt are compounded with iron, and is one of materials that have a low thermal expansion coefficient at around room temperature among metals. Kovar has a thermal expansion coefficient close to those of an alkali-free glass, a blue soda-lime glass, a borosilicate glass, and the like. One example of the component ratio of Kovar is, nickel: 29 mass %, cobalt: 17 mass %, silicon: 0.2 mass %, manganese: 0.3 mass %, and iron: 53.5 mass %. The component ratio of Kovar is not specifically limited, and an appropriate component ratio may be adopted such that the thermal expansion coefficient of Kovar is close to the thermal expansion coefficients of the cover main portion 61 and the second substrate 21. As the fritted glass in this case, a material whose thermal expansion coefficient matches the thermal expansion coefficient of the alloy is preferably adopted. Here, when the material of the metal ring is Kovar, a Kovar glass is preferably used as the material for the fritted glass.

When both the cover main portion 61 and the frame portion 62 are formed with glass, as shown in FIG. 13, the difference of the linear expansion coefficients can be reduced compared with the case where the cover main portion 61 and the frame portion 62 are formed with glass and an alloy, respectively, as shown in FIG. 14, and as a result reliability of the bond between the cover main portion 61 and the frame portion 62 can be improved.

In any of a case where the light emission device is designed to emit light through the wiring board 20 and a case where the light emission device is designed to emit light through the cover main portion 61, it is possible to use a cover formed by bonding the cover main portion 61 and the frame portion 62 which are separate parts.

Moreover, a water absorbing material is preferably provided on the cover 60 at an appropriate location. In this regard, when the light emission device is designed to emit light via the cover main portion 61, the water absorbing material is preferably disposed so as not to overlap the aforementioned projection of the light emission portion of the organic electroluminescent element 10. Note that, the water absorbing material may be a calcium oxide-based desiccating agent (better in which calcium oxide is kneaded).

Moreover, in the light emission device, an anti-reflection coat (hereinafter abbreviated as AR film) that is formed of a single layer or a multi-layer dielectric films, for example, is preferably provided on at least one face of the cover main portion 61 orthogonal to the thickness direction. In the light emission device, a Fresnel loss can thereby be reduced at an interface between the cover 60 and a medium in contact with the cover 60, and as a result the light outcoupling efficiency can be improved. In the light emission device, instead of the AR film, a moth-eye structure may be provided that has a two-dimensional periodic structure in which tapering off fine projections are disposed in a two-dimensional array. When the moth-eye structure is formed by processing the glass substrate that is a base of the cover main portion 61 with a nanoimprint method, the refractive index of the fine projection becomes close to as the refractive index of the glass substrate. When the moth-eye structure is provided, compared with the case where the AR film is provided, dependency to the light wavelength and the incident angle can be reduced and reflectivity can be decreased.

The aforementioned moth-eye structure may be formed with a method other than the nanoimprint method (such as laser beam machining technique). Similarly, the moth-eye structure may be constituted by a moth-eye structure anti-reflective film by Mitsubishi Rayon Co., Ltd., for example.

Figure 15:
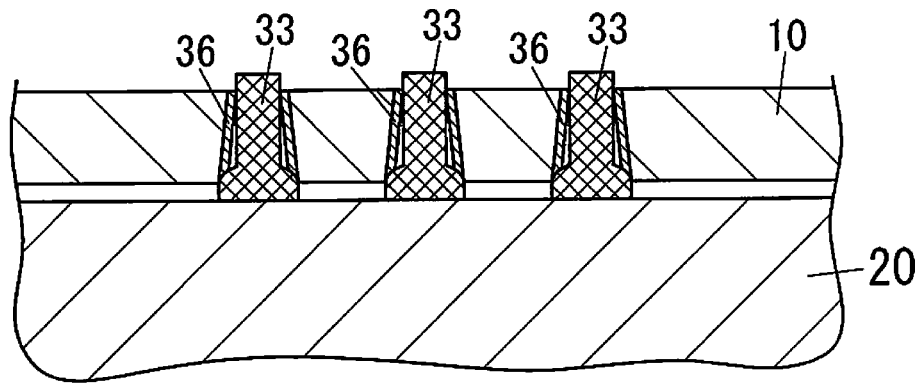
FIG. 15 is a schematic cross-sectional view of a main section of another exemplary configuration of the light emission device of Embodiment 1.
Figure 16:
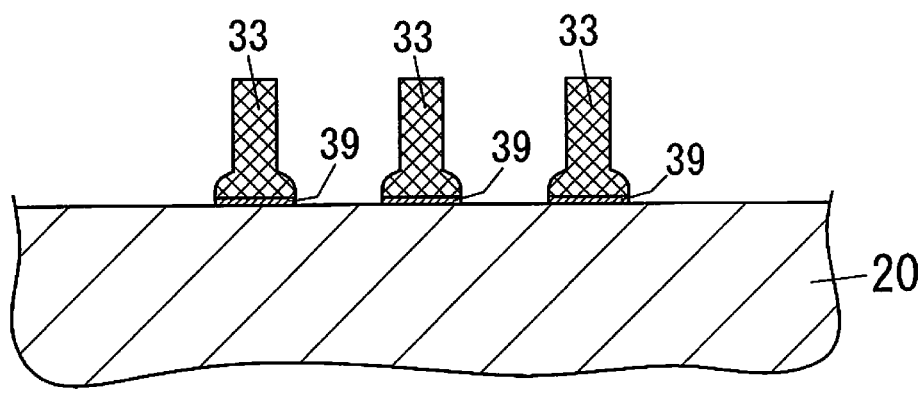
FIG. 16 is an explanatory drawing of a manufacturing method of another exemplary configuration of the first protrusion electrode of the light emission device of Embodiment 1.

The shapes of the penetrating electrode 36 and the protrusion electrode 33 are not limited to the aforementioned example. For example, the shape of the penetrating electrode 36 may be such a tapered cylindrical shape that an area of the aperture of the penetrating electrode 36 becomes gradually greater towards one end of the penetrating electrode 36 than at the other end closer to the wiring board 20, and the protrusion electrode 33 may have such a pole shape that it includes a circular cylindrical portion with an outer diameter substantially the same as the minimum inner diameter of the penetrating electrode 36 and a large-diameter portion with an outer diameter greater than the maximum inner diameter of the penetrating electrode 36. Note that, in this case, as shown in FIG. 16, to the wiring board 20, the protrusion electrode 33 may be welded or bonded with using a bond 39 made of solder, electrically conductive paste (e.g., silver paste and gold paste), or the like. In this case, the large-diameter portion of the protrusion electrode 33 serves as the aforementioned spacer 35. Furthermore, each protrusion electrode 33 as shown in FIGS. 15 and 16 has such a shape that the outer diameter of the protrusion electrode 33 is gradually changed from the circular cylindrical portion to the large-diameter portion. The protrusion electrode 33 may be prepared by trimming as described above.

Figure 17:
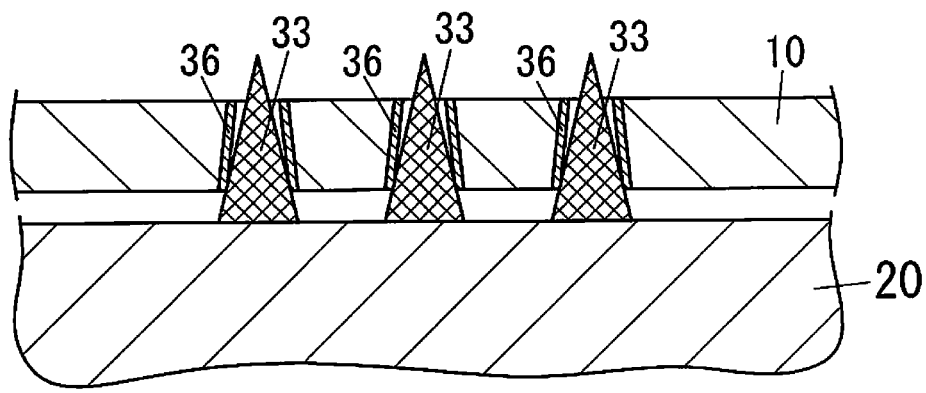
FIG. 17 is a schematic cross-sectional view of a main section of another exemplary configuration of the light emission device of Embodiment 1.

The protrusion electrode 33 may have a conical shape as shown in FIG. 17. Besides, the protrusion electrode 33 may have a pyramidal shape. Such a protrusion electrode 33 may be prepared by trimming as described above. Note that, the penetrating electrode 36 shown in FIG. 17 has a tapered cylindrical shape. The maximum inner diameter of the penetrating electrode 36 may be within a range of 0.2 to about 0.5 mm, for example.

Figure 18A:
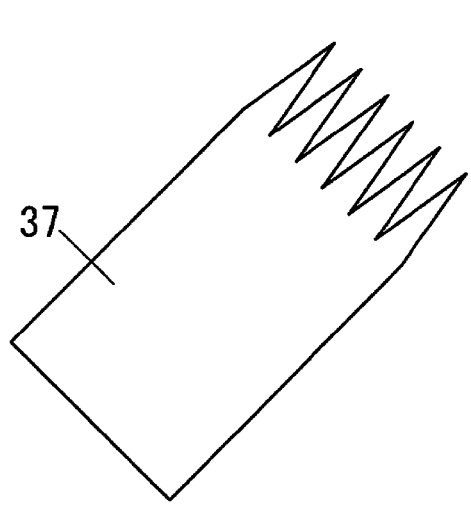
FIGS. 18A and 18B are explanatory drawings of a manufacturing method of another exemplary configuration of the first protrusion electrode of the light emission device of Embodiment 1.
Figure 18B:
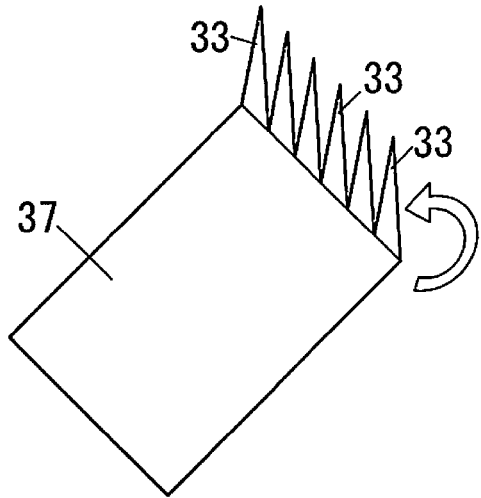

In addition, the protrusion electrodes 33 may be formed by use of a metal plate 37 as shown in FIG. 18A. The metal plate 37 is formed into a comb-like shape to have comb-like teeth. The comb-like teeth are bent to serve as the protrusion electrodes 33 individually, as shown in FIG. 18B (the arrow indicates the direction for bending). In this case, a plurality of the protrusion electrodes 33 can be treated as a single part, and therefore the manufacture of the light emission device can be facilitated. Note that the metal plate 37 may be made of a lead frame or the same material as the lead frame.

As shown in FIG. 17 and the like, when the protrusion electrode 33 has an end with a tapered shape, it is possible to make a through hole in the organic electroluminescent element 10 by use of the protrusion electrode 33. Therefore, for example, it is possible to adopt a manufacturing process including steps of applying an electrically conductive adhesive insides of the first through hole 15 and the second through hole 17 with using a dispenser or the like, and subsequently making the hole with the protrusion electrode 33 before the electrically conductive adhesive is baked, and then baking the electrically conductive adhesive to form the penetrating electrode 36 with the hollow cylindrical shape.

Figure 19:
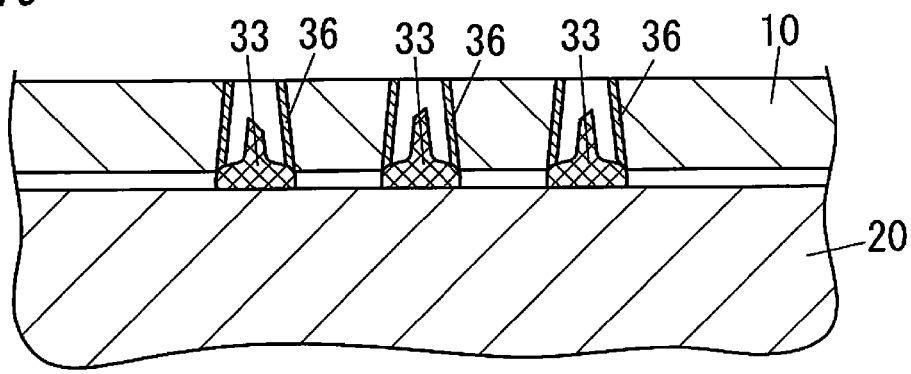
FIG. 19 is a schematic cross-sectional view of a main section of another exemplary configuration of the light emission device of Embodiment 1.
Figure 20:
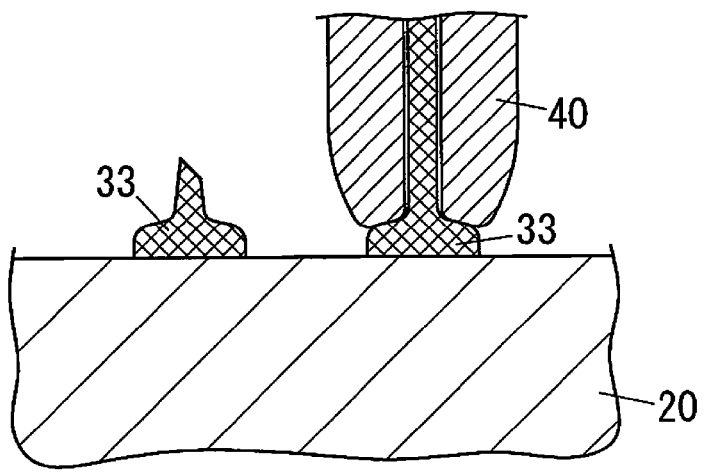
FIG. 20 is an explanatory drawing of a manufacturing method of another exemplary configuration of the first protrusion electrode of the light emission device of Embodiment 1.

The protrusion electrode 33 may have a stud bump-like shape as shown in FIG. 19. The material of the protrusion electrode 33 in this case is preferably, but is not limited thereto, and may be aluminum or copper. Such a protrusion electrode 33 may be prepared by a similar manner to a general stud bump with using a capillary 40 for an ultrasonic and heat combined-type wire bond. When the protrusion electrode 33 with the stud bump-like shape is adopted, the maximum inner diameter of the penetrating electrode 36 with the tapered hollow cylindrical shape may fall within a range of 50 to about 100 μm. Hence, it is possible to reduce the size of the protrusion electrode 33.

Figure 21:
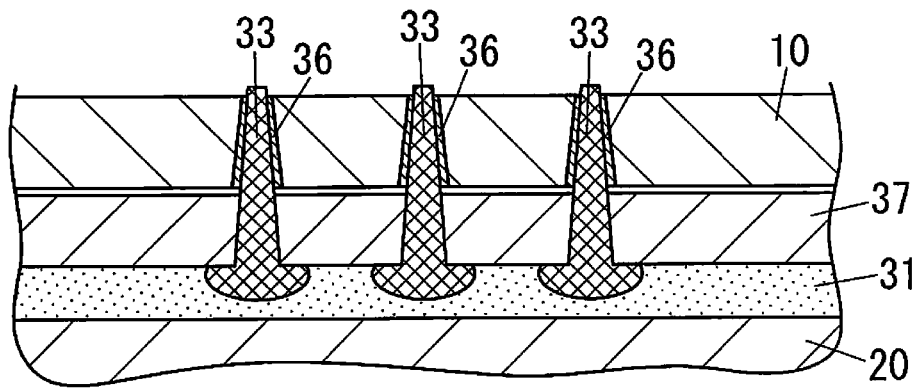
FIG. 21 is a schematic cross-sectional view of a main section of another exemplary configuration of the light emission device of Embodiment 1.
Figure 22A:
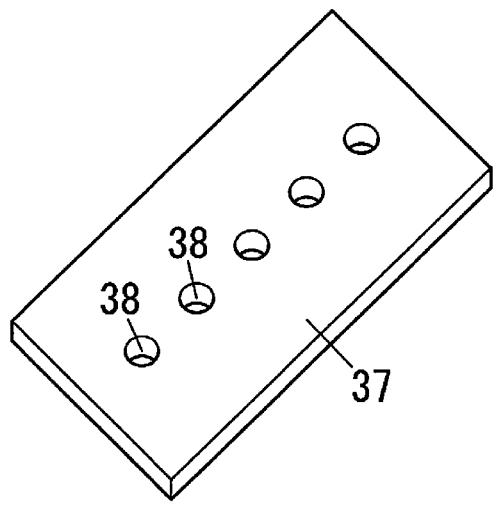
FIGS. 22A and 22B are explanatory drawings of a manufacturing method of another exemplary configuration of the first protrusion electrode of the light emission device of Embodiment 1.
Figure 22B:
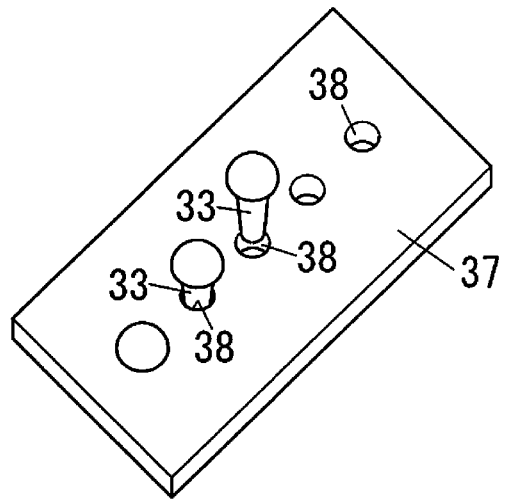

As shown in FIG. 21, the protrusion electrode 33 may have a shape of a tapered pin having a head portion. In this case, as shown in FIG. 22A, the metal plate 37 with a hole 38 is prepared, then the axle portion of the protrusion electrode 33 is inserted into the hole 38 as shown in FIG. 22B and furthermore into the penetrating electrode 36, and thereafter the head portion of the protrusion electrode 33 and the metal plate 37 is bonded to the wiring board 20 through the bond 31 made of an electrically conductive adhesive (e.g., silver paste and gold paste), for example. When the protrusion electrode 33 may have the shape of the tapered pin having the head portion, positioning of the protrusion electrode 33 is facilitated.

Figure 23:
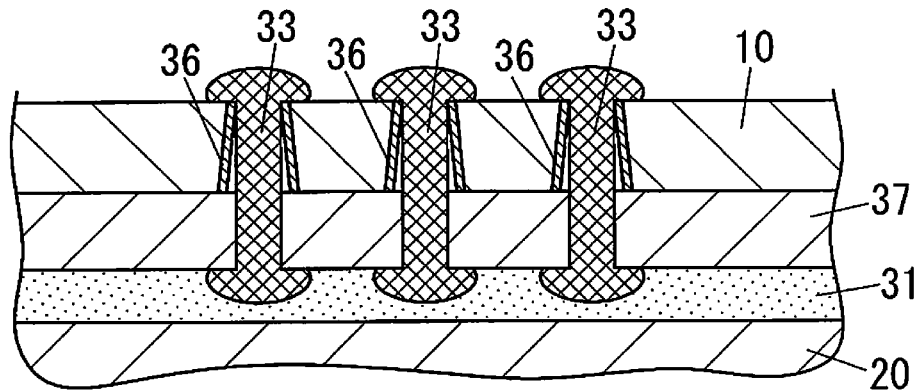
FIG. 23 is a schematic cross-sectional view of a main section of another exemplary configuration of the light emission device of Embodiment 1.

Furthermore, the protrusion electrode 33 may have a rivet-like shape as shown in FIG. 23. Regarding such a protrusion electrode 33, as shown in FIG. 22A, a metal plate 37 with a hole 38 is prepared, then the axle portion of the protrusion electrode 33 is inserted into the hole 38 as shown in FIG. 22B and further more into the penetrating electrode 36, subsequently an end portion of the axle portion is swaged (as a result the protrusion electrode 33 has head portions at both end portions of the axle portion), thereafter one head portion of the protrusion electrode 33 and the metal plate 37 may be bonded to the wiring board 20 through the bond 31 made of an electrically conductive adhesive (e.g., silver paste and gold paste), for example.

The light emission device of the present embodiment as described above, the first electrode 12 and the second electrode 14 includes the first extended portion 12b and the second extended portion 14b which extend outside from sides of the light-emitting unit, respectively. The light-emitting unit is the overlap of the first electrode 12, the functional layer 13, and the second electrode 14. The first extended portion 12b and the second extended portion 14b overlap the first patterned conductor 22 and the second patterned conductor 24 of the wiring board 20 in the thickness direction, respectively. Moreover, in the light emission device, the first connection part 32 includes the first through-hole wire 32a with a hollow cylindrical shape and the first protrusion electrode 32b protruding from the first patterned conductor 22 along the thickness direction to be inside the first through-hole wire 32a so as to be electrically connected to the first through-hole wire 32a. Furthermore, in the light emission device, the second connection part 34 includes the second through-hole wire 34a with a hollow cylindrical shape and the second protrusion electrode 34b protruding from the second patterned conductor 24 along the thickness direction to be inside the second through-hole wire 34a so as to be electrically connected to the second through-hole wire 34a. Accordingly, the light emission device does not require a room for bonding wires connecting the first extended portion 12b to the first patterned conductor 22 and connecting the second extended portion 14b to the second patterned conductor 24. Therefore, it is possible to increase an area of the aforementioned light-emitting unit in a plan view of the light emission device. Hence, according to the light emission device of the present embodiment, it is possible to reduce an area of the non-light emitting portion in a plan view.

The light emission device of the present embodiment preferably includes, as described above, the spacer 35 that is present between the second substrate 21 and the organic electroluminescent element 10 to keep the second substrate 21 and the organic electroluminescent element 10 separated by a distance from each other. Accordingly, in the light emission device, since the second substrate 21 and the organic electroluminescent element 10 can be kept separated by the distance from each other by the spacer 35, it is possible to prevent contact between the organic electroluminescent element 10 and the wiring board 20. Therefore, in the light emission device, it is possible to suppress the in-plane variation of the temperature of the light-emitting layer of the organic electroluminescent element 10, and to suppress the in-plane variation of luminance.

Figure 24:
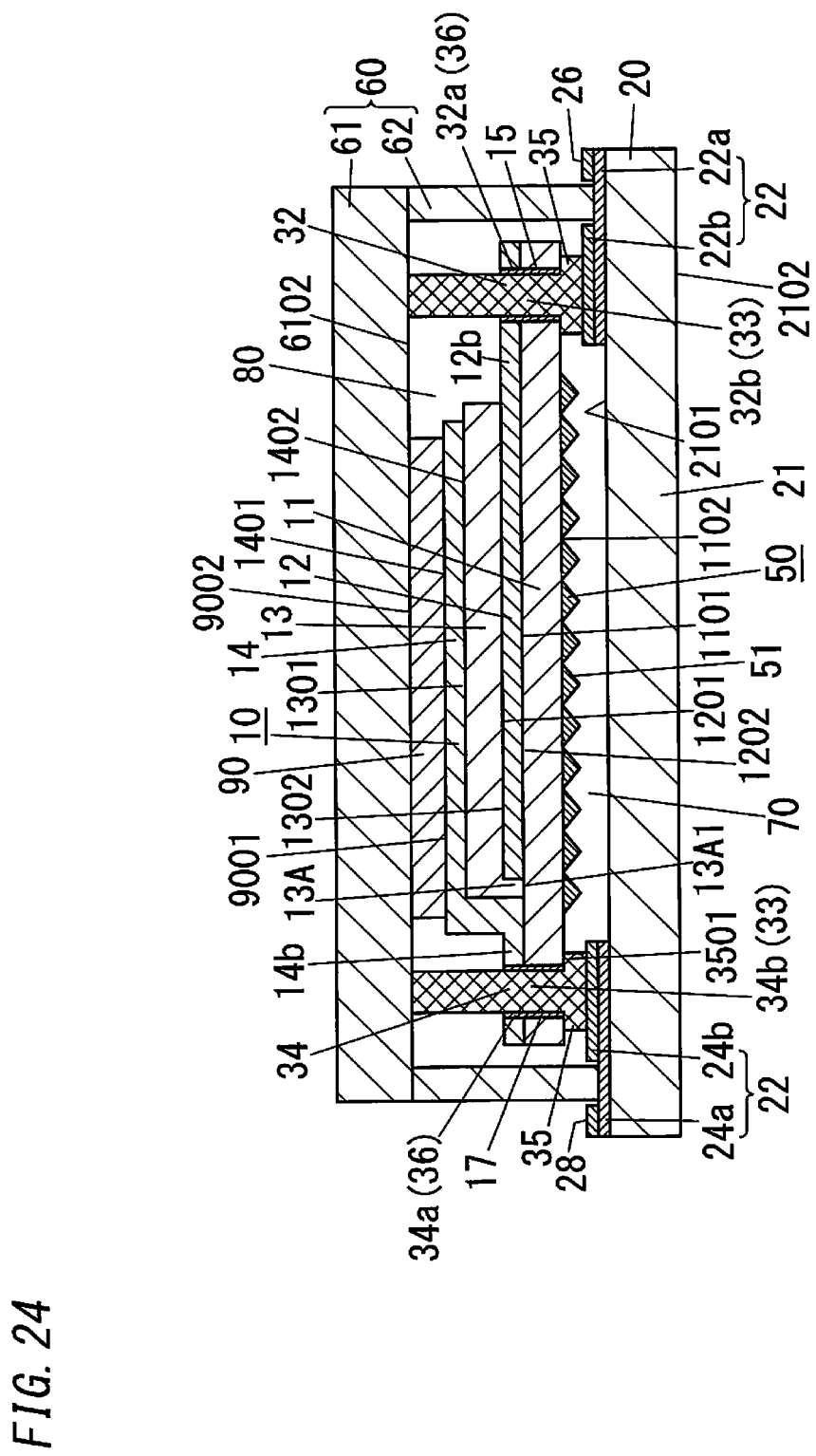
FIG. 24 is a schematic cross-sectional view of a light emission device of Embodiment 2.

Hereinafter, a light emission device of the present embodiment will be described with reference to FIG. 24.

A basic configuration of the light emission device of the present embodiment is substantially the same as that of Embodiment 1. The light emission device of the present embodiment is different from that of Embodiment 1 in that a resin member 90 is provided between the organic electroluminescent element 10 and the cover 60 in the thickness direction of the organic electroluminescent element 10. Note that constituent elements similar to those in Embodiment 1 are provided with the same reference numerals, and redundant description thereof will be omitted.

The resin member 90 may be formed of an epoxy adhesive or an acrylic adhesive, for example. When the light emission device is designed not to emit light through the cover 60, the resin member 90 may be formed of a mixture of an epoxy resin and a desiccating agent. In this case, the light emission device can have improved moisture resistance and improved reliability. Alternatively, the resin member may be a two-sided adhesive tape. As this two-sided adhesive tape, an adhesive tape using an acrylic adhesive or an epoxy adhesive that is a low outgassing adhesive and is not corrosive to the first electrode 12, the second electrode 14, and the light-emitting layer may be used. As an adhesive tape that uses an acrylic adhesive, OCA tape available from Sumitomo 3M Limited may be used, for example.

Since the light emission device of the present invention includes the resin member 90 present between the organic electroluminescent element 10 and the cover 60, it is possible to prevent vibration or shock from causing separation of the organic electroluminescent element 10 from the wiring board 20. Therefore, it is possible to improve reliability of the electrical connection to the first connection part 32 and to the second connection part 34.

In the light emission device of the present embodiment, regarding each of the first connection part 32 and the second connection part 34 may have any of various shapes described in Embodiment 1.

Hereinafter, a light emission device of the present embodiment will be described with reference to FIGS. 25 and 26.

In the Embodiments 1 and 2 described above, described are devices in which two organic electroluminescent elements 10 and 10 are arranged side by side on the surface 2101 of the second substrate 21 (first surface of second substrate 21). Then, in the present embodiment, a more preferable embodiment will be illustrated, but is not limited to the description below. A part of descriptions of configurations that have already been described in detail in the above Embodiments 1 and 2 will be omitted.

Figure 25:
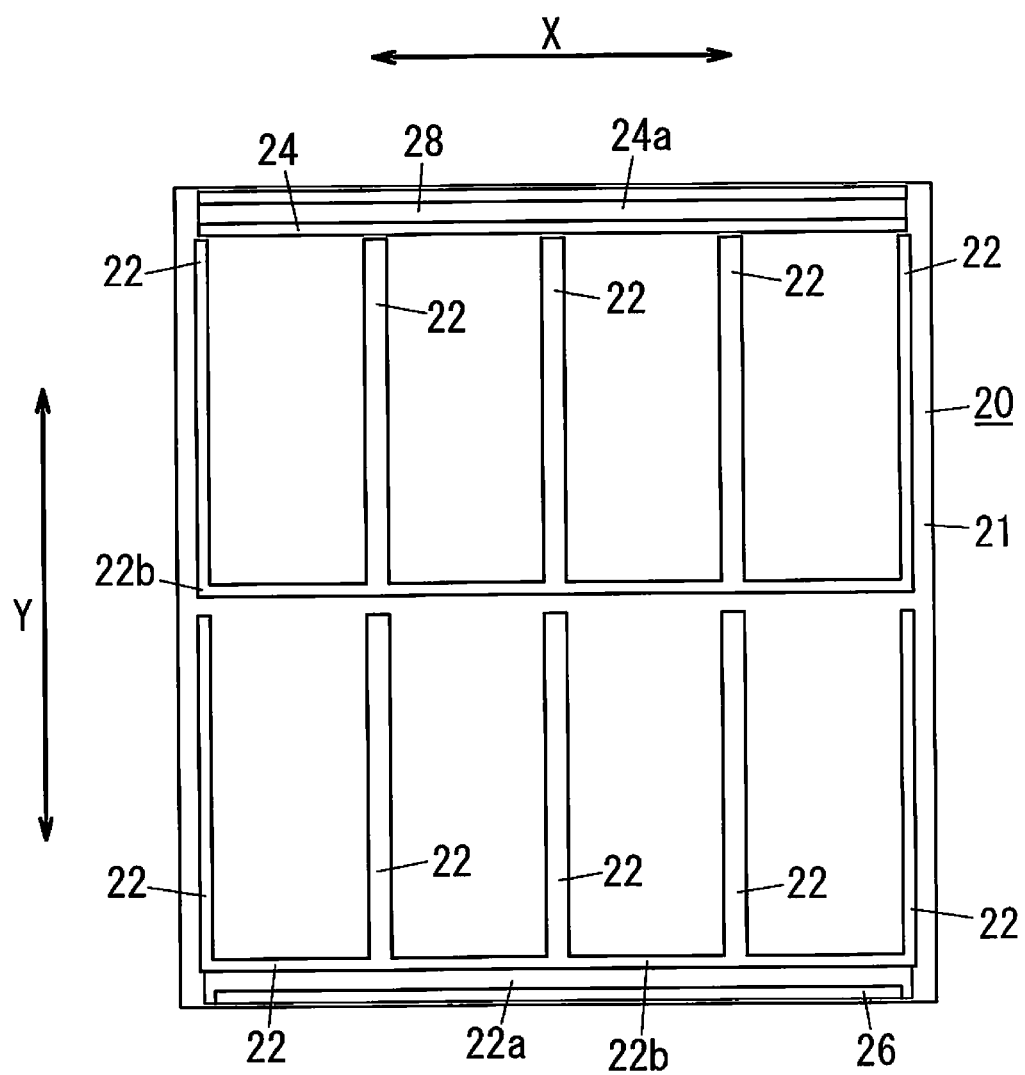
FIG. 25 is a plan view illustrating an example of a first patterned conductor and a second patterned conductor in a light emission device of Embodiment 3.
Figure 26:
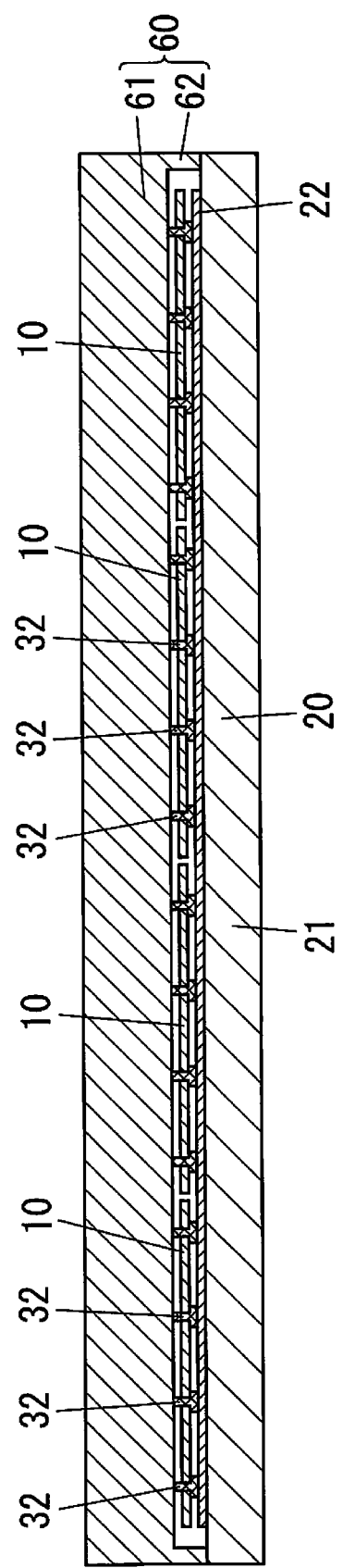
FIG. 26 is a schematic cross-sectional view of a light emission device of Embodiment 3.

In the light emission device of the present embodiment, when four organic electroluminescent elements 10 are arranged in the lateral direction X and two organic electroluminescent elements are arranged in the longitudinal direction Y, as shown in FIGS. 25 and 26, the first patterned conductor 22 is formed into a comb shape having five comb teeth. Then the two adjacent first patterned conductors 22 are arranged along the longitudinal direction Y on the second substrate 21. In this case, an edge of the second substrate 21 in the longitudinal direction Y (first edge of second substrate 21 in longitudinal direction Y) has a free space on which no first patterned conductor 22 is formed, and the second patterned conductor 24 is disposed on the free space. Moreover, the first protrusion electrode 32b and the second protrusion electrode 34b are provided on the first patterned conductor 22 and the second patterned conductor 24, respectively. Furthermore, the first through-hole wire 32a and the second through-hole wire 34a are formed in the first extended portion 12b and the second extended portion 14b, respectively. Accordingly, the first protrusion electrode 32b and the second protrusion electrode 34b are to be inserted into the first through-hole wire 32a and the second through-hole wire 34a, respectively. In other words, the first extended portion 12b of the organic electroluminescent element 10 is connected to the first patterned conductor 22 via the first protrusion electrode 32b and the first through-hole wire 32a, and the second extended portion 14b is connected to the second patterned conductor 24 via the second protrusion electrode 34b and the second through-hole wire 34a. Besides, in the embodiment, it is preferable that the organic electroluminescent element 10 may be electrically connected to patterned conductors including the first patterned conductor 22 and the patterned conductor 24 in the same manner as that described in Embodiment 1 or 2. In addition, regarding arrangement of the organic electroluminescent element 10, the number of organic electroluminescent elements 10 arranged over the second substrate 21 is not particularly limited. When n (n represents the number of organic electroluminescent elements arranged in the lateral direction X, and is a positive integer) and m (m represents the number of organic electroluminescent elements arranged in the longitudinal direction Y, and is a positive integer) organic electroluminescent elements in the longitudinal direction Y are arranged, (n+1) comb teeth that are arranged in parallel in the lateral direction X and one interconnection portion (portion of first patterned conductor 22) that extends in the lateral direction X constitutes one comb shaped second patterned conductor 24 in a planar view, and m first patterned conductors 22 may be arranged side by side along the longitudinal direction Y. The edge of the second substrate 21 in the longitudinal direction Y (first edge of second substrate 21 in longitudinal direction Y) has a free space on which no first patterned conductor 22 is formed, and it is sufficient that the first patterned conductor 22 is disposed on the free space.

That is to say, when a plurality of organic electroluminescent elements 10 are arranged over the second substrate 21, according to the number of organic electroluminescent elements 10, the number of comb teeth and the number of first patterned conductors 22 in the longitudinal direction Y may be selected appropriately. Since the organic electroluminescent elements 10 that are arranged in the lateral direction X are thereby electrically connected in parallel, an increase in drive voltage may be avoided. Further, since the organic electroluminescent elements 10 that are arranged in the longitudinal direction Y are electrically connected in series, drive voltage fluctuation is unlikely to occur and driving can be stabilized. Furthermore, due to arranging the plurality of organic electroluminescent elements 10 along the lateral direction X and the longitudinal direction Y, since the size of the light emission device can be arbitrarily enlarged, the number of options regarding the size and the drive power of the light emission device can be increased and usability can be improved.

Due to arranging a plurality of organic electroluminescent element 10 over a single second substrate 21, the size of the light emission device can be easily designed. Further, since the size of the light emission device can be changed as necessary, constituent members of the light emission device such as the organic electroluminescent element 10 and the second substrate 21 are to be used in common. That is, manufacturing cost can be reduced due to sharing of the member cost.

Hereinafter, a light emission device of the present embodiment will be described with reference to FIGS. 27A to 29F.

Figure 27A:
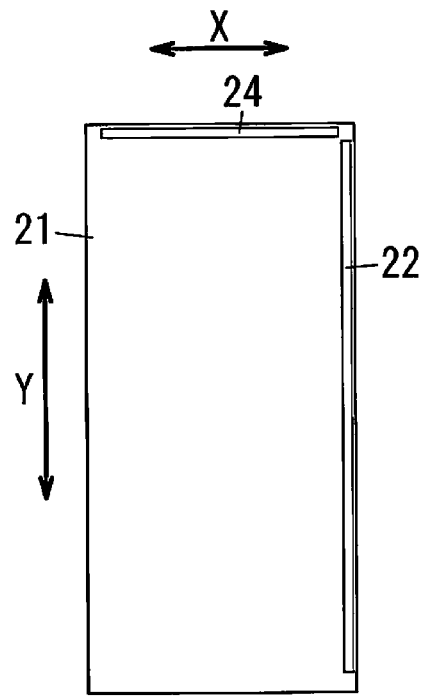
FIGS. 27A and 27B are plan views illustrating an example of a first patterned conductor and a second patterned conductor in a light emission device of Embodiment 4.
Figure 27B:
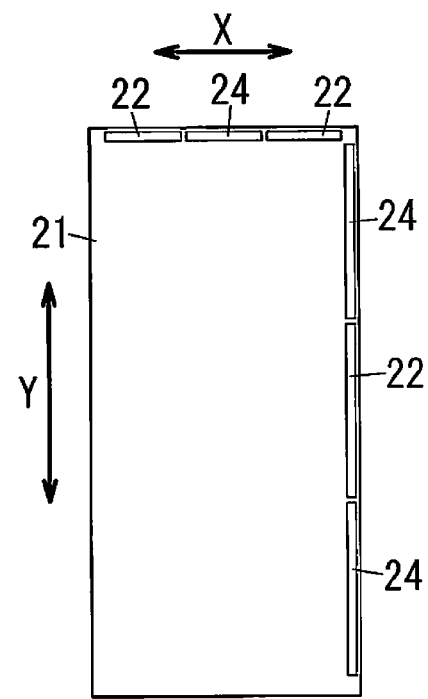

In Embodiments 1 to 3, the second substrate 21 on which the comb shaped first patterned conductor 22 is formed is described. In this case, in the light emission device, electrical paths are connected in one direction along the longitudinal direction Y. The present embodiment will be illustrated as an application embodiment of Embodiment 1 to 3. FIGS. 27A and 27B illustrate aspects of the first patterned conductor 22 and the second patterned conductor 24 arranged on the surface 2101 of the second substrate 21 (first surface of second substrate 21).

The second substrate 21 shown in FIG. 27A is provided with the first patterned conductor 22 and the second patterned conductor 24. On the surface 2101 of the second substrate 21 (first surface of second substrate 21), the first patterned conductor 22 extends along an edge of the second substrate in the lateral direction X (first edge of second substrate in lateral direction X) and the second patterned conductor 24 extends along an edge of the second substrate in the longitudinal direction Y (first edge of second substrate in longitudinal direction Y). Therefore, the first patterned conductor 22 and the second patterned conductor 24 constitute an L-shaped patterned conductor formed on the second substrate 21. Then, on the first patterned conductor 22 and the second patterned conductor 24, provided are the first protrusion electrode 32b and the second protrusion electrode 34b, respectively. Besides, in the embodiment, it is preferable that the organic electroluminescent element 10 may be electrically connected to patterned conductors including the first patterned conductor 22 and second patterned conductor 24 in the same manner as that described in Embodiment 1 or 2. Here, the first patterned conductor 22 and the second patterned conductor 24 are separated by a predetermined distance so as not to be connected each other electrically. It is preferable that, in this case, an insulator is provided between the first patterned conductor 22 and the second patterned conductor 24.

Figure 28A:
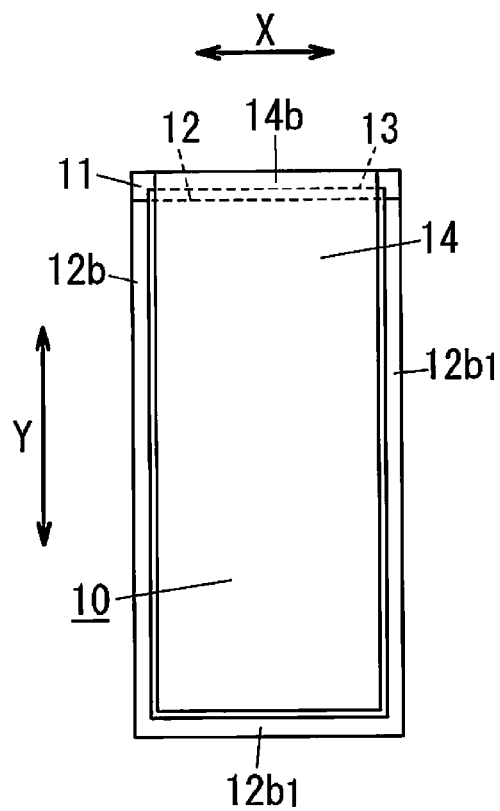
FIGS. 28A and 28B are schematic plan views illustrating an example of an organic electroluminescent element in the light emission device of Embodiment 4.

When the first substrate 11 (organic electroluminescent element 10) is placed over the second substrate 21 formed in this way, an organic electroluminescent element 10 shown in FIG. 28A may be used. The organic electroluminescent element 10 is the same as the organic electroluminescent element 10 described in Embodiments 1 to 3. Thus, in this organic electroluminescent element 10, the first through-hole wire 32a and the second protrusion electrode 34b may be provided in the first extended portion 12b and the second extended portion 14b, respectively.

In disposing the organic electroluminescent element 10 over the second substrate 21, the first extended portion 12b and the second extended portion 14b are preferably connected electrically to the first patterned conductor 22 and the second patterned conductor 24, respectively. It is preferable that, in this case, an insulator is provided so as to be present between the first extended portion 12b1 and the second substrate 21 at portions of the second substrate 21 where the first patterned conductor 22 and the second patterned conductor 24 are not arranged. Further, the insulator preferably has a predetermined thickness. Specifically, when each of the first protrusion electrode 32b and the second protrusion electrode 34b is provided with the spacer 35, the predetermined thickness of the insulator is determined to allow the insulator to be flush with the spacer 35. Since the insulator with the predetermined thickness is provided between the first extended portion 12b1 and the second substrate 21, the organic electroluminescent element 10 is placed over the second substrate 21 stably.

When the organic electroluminescent element 10 is placed over the second substrate 21 that is provided with the first patterned conductor 22 and the second patterned conductor 24 as described above, one or more of L-shaped electrical paths are formed in the organic electroluminescent element 10. Patterned conductors serving as the second patterned conductor 24 and the second extended portions 14b are preferably used as a part of a plurality of kinds of patterned conductors that are arranged on the one second substrate 21 (combination of patterned conductors in Embodiments 1 to 3 and the patterned conductor in FIG. 27A, for example). But it is not limited thereto, and, for example, the second substrate 21 on which the aforementioned patterned conductors are arranged and one organic electroluminescent element 10 (first substrate 11) may be sealed with the cover 60 so as to form a single light emission device.

In this case, a room (not shown) for sealing to be bonded to the cover 60 is provided at a periphery of the second substrate 21 (outside of first patterned conductor 22 and second patterned conductor 24). Further, the first external interconnection electrode 26 and the second external interconnection electrode 28 are provided outside the cover 60. The first external interconnection electrode 26 is connected electrically to the first conduction layer 22a, that is, to the first patterned conductor 22, and the second external interconnection electrode 28 is connected electrically to first conduction layer 24a, that is, to the second patterned conductor 24.

Here, in the patterned conductors on the second substrate 21, layout locations of the first patterned conductor 22 and the second patterned conductor 24 are not limited to the above embodiments. The first patterned conductor 22 and the second patterned conductor 24 may be arranged at an edge and another edge of the second substrate 21 in the lateral direction X (first edge of second substrate 21 in lateral direction X and second edge of second substrate 21 in lateral direction X), respectively, or at an edge and another edge of the second substrate 21 in the longitudinal direction Y (first edge of second substrate 21 in longitudinal direction Y and second edge of second substrate 21 in longitudinal direction Y), respectively. In this case, one or more of electrical paths can be connected in a direction selected from the lateral direction X and the longitudinal direction Y of the second substrate 21. Locations of the first patterned conductor 22 and the second patterned conductor 24 may be exchanged in accordance with the direction of the electrical paths.

The second substrate 21 shown in FIG. 27B is provided with the first patterned conductor 22 and the second patterned conductor 24. On the surface 2101 of the second substrate 21 (first surface of second substrate 21), the first patterned conductor 22 and the second patterned conductor 24 are arranged at an edge of the second substrate in the lateral direction X (first edge of second substrate in lateral direction X) and at an edge in the longitudinal direction Y (first edge of second substrate in longitudinal direction Y). Here, the first patterned conductors 22 and the second patterned conductors 24 are arranged alternately and side by side, and the first patterned conductors 22 and the second patterned conductors 24 constitute a patterned conductor with an L-shape formed on the second substrate 21. Then, on the first patterned conductor 22 and the second patterned conductor 24, provided are the first protrusion electrode 32b and the second protrusion electrode 34b, respectively. Besides, in the embodiment, it is preferable that the organic electroluminescent element 10 may be electrically connected to patterned conductors including the first patterned conductor 22 and second patterned conductor 24 in the same manner as that described in Embodiment 1 or 2. Here, the first patterned conductor 22 and the second patterned conductor 24 are separated by a predetermined distance so as not to be connected each other electrically. It is preferable that, in this case, an insulator is provided between the first patterned conductor 22 and the second patterned conductor 24.

Figure 28B:
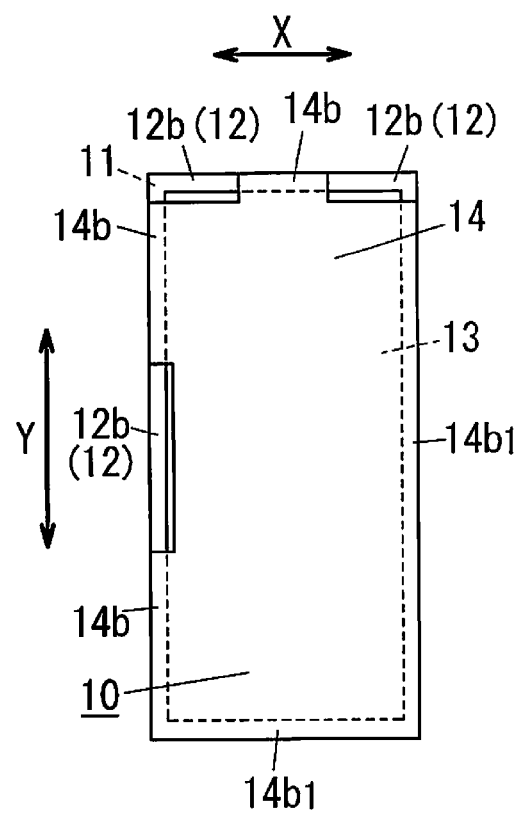

When the first substrate 11 (organic electroluminescent element 10) is placed over the second substrate 21 formed in this way, an organic electroluminescent element 10 shown in FIG. 28B can be used. The organic electroluminescent element 10 can be obtained similarly to the organic electroluminescent element 10 described in Embodiments 1 to 3. The first electrode 12 and the second electrode 14 are formed to have the same dimensions of the first substrate 11 in the lateral direction X and the longitudinal direction Y, and after forming the second electrode 14, one portion 12b of the first electrode 12 and one portion of the function layer 13 can be exposed due to performing etching processing with a known etching method.

However, a location where the first extended portion 12b is exposed is not limited to this, and may be set in accordance with the patterned conductors on the second substrate. In the organic electroluminescent element 10 that is obtained in this way, also, the first through-hole wire 32a may be provided on the first extended portion 12b and the second through-hole wire 34a may be provided in the second extended portion 14b.

In placing the organic electroluminescent element 10 over the second substrate 21, the first extended portion 12b and the second extended portion 14b are preferably connected electrically to the first patterned conductor 22 and the second patterned conductor 24, respectively. It is preferable that, in this case, an insulator is provided so as to be interposed between the second extended portion $14b_1$ and the second substrate 21 at portions on the second substrate 21 where the first patterned conductor 22 and the second patterned conductor 24 are not arranged. Further, the insulator preferably has a predetermined thickness. Specifically, when each of the first protrusion electrode 32b and the second protrusion electrode 34b is provided with the spacer 35, the predetermined thickness of the insulator is determined to allow the insulator to be flush with the spacer 35. Since the insulator with the predetermined thickness is provided between the second extended portion 14b1 and the second substrate 21, the organic electroluminescent element 10 is placed over the second substrate 21 stably.

As described above, when the organic electroluminescent element 10 is placed over the second substrate 21 that is provided with the first patterned conductors 22 and the second patterned conductors 24, a plurality of L-shaped electrical paths will be formed in the organic electroluminescent element 10.

Patterned conductors serving as the second patterned conductor 24 and the second extended portion 14b are preferably used as a part of a plurality of kinds of patterned conductors that are placed on one second substrate 21 (combination of patterned conductors in Embodiments 1 to 3, the patterned conductor in FIG. 27A, and patterned conductor in FIG. 27B, for example). But it is not limited thereto, and, for example, the second substrate 21 on which the aforementioned patterned conductors are placed and one organic electroluminescent element 10 (first substrate 11) may be sealed with the cover 60 so as to form a single light emission device.

In this case, a room (not shown) for sealing to be bonded to the cover 60 is provided at a periphery of the second substrate 21 (outside of first patterned conductor 22 and second patterned conductor 24). Further, the first external interconnection electrode 26 and the second external interconnection electrode 28 are provided outside the cover 60. Accordingly, the first external interconnection electrode 26 is connected electrically to the first conduction layer 22a, that is, to the first patterned conductor 22, and the second external interconnection electrode 28 is connected electrically to the first conduction layer 24a, that is, to the second patterned conductor 24.

Here, in the patterned conductors on the second substrate 21, layout locations of the first patterned conductor 22 and the second patterned conductor 24 are not limited to the above embodiment. The first patterned conductor 22 and the second patterned conductor 24 may be arranged at an edge and another edge of the second substrate 21 in the lateral direction X (first edge of second substrate 21 in lateral direction X and second edge of second substrate 21 in lateral direction X), respectively, or at an edge and another edge of the second substrate 21 in the longitudinal direction Y (first edge of second substrate 21 in longitudinal direction Y and second edge of second substrate 21 in longitudinal direction Y), respectively. In this case, a plurality of electrical paths can be connected in a direction selected from the lateral direction X and the longitudinal direction Y of the second substrate 21. Locations of the first patterned conductors 22 and the second patterned conductors 24 may be exchanged in accordance with the direction of the electrical path.

FIGS. 29A to 29F illustrate various light emission devices. In these light emission devices, a plurality of organic electroluminescent elements 10 (first substrates 11) are arranged over the second substrate 21 and are covered with the cover 60. In this regard, the organic electroluminescent elements 10 may be covered with a plurality of covers 60. Here, the plurality of organic electroluminescent elements 10 are formed as a light-emitting module. In these light emission devices, a plurality of kinds of patterned conductors, as described above, are provided on the second substrate 21. That is, due to combining a various patterned conductors in the light emission device, an electrical path Q is a series connected path having a traversable curved shape that is drawn over the surface of the second substrate 21 while the electrical path Q has at least one bend P. As an example of a curve drawn on a plane, a Hilbert curve shaped pattern (FIG. 29E) or the like can be given. But it is not limited thereto, that is, a plurality of kinds of patterned conductors form the electrical path Q in the light emission device, and the electrical path Q may be the series connected path having a traversable curved shape over the face of the second substrate 21 while having the bend P. In this way, since the electrical path Q is a traversable series path having the bend P arranged over the face of the second substrate 21, drive voltage fluctuation in the light emission device is unlikely to occur. Further, the uniformity of emission luminance of each of organic electroluminescent elements 10 can be improved.

At an adjacent location between the adjacent first substrates 11, a pair of the first patterned conductor 22 and the second patterned conductor 24 is present to allow the formation of the electrical path Q. When the electrical path Q is constituted by the patterned conductors, it is preferable that the first substrate 11 has two or more sides over adjacent locations where the pairs are not present, and is adjacent to another first substrate. In this case, the number of electrical paths Q in the light emission device is preferably one or more.

Figure 29A:
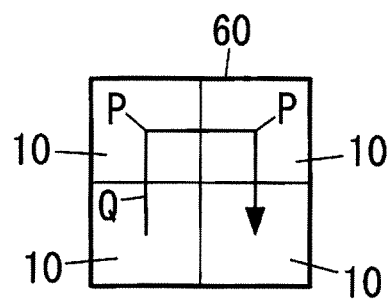
FIGS. 29A to 29F are schematic plan views illustrating examples of the light emission device of Embodiment 4.
Figure 29B:
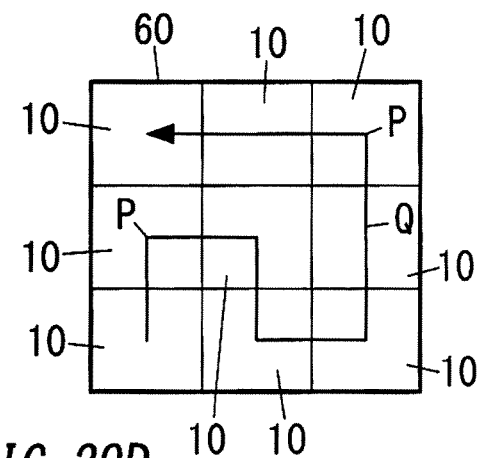
Figure 29C:
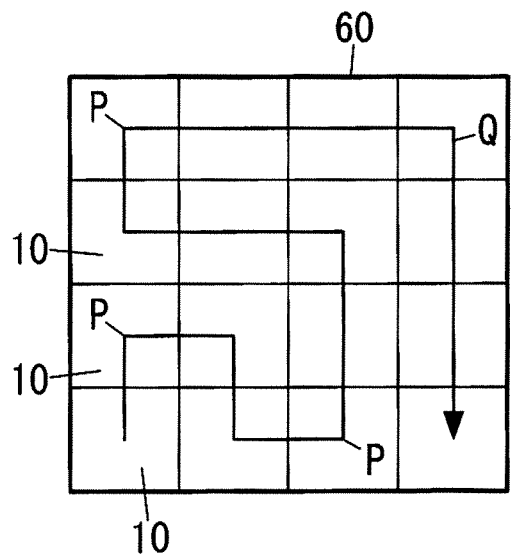
Figure 29D:
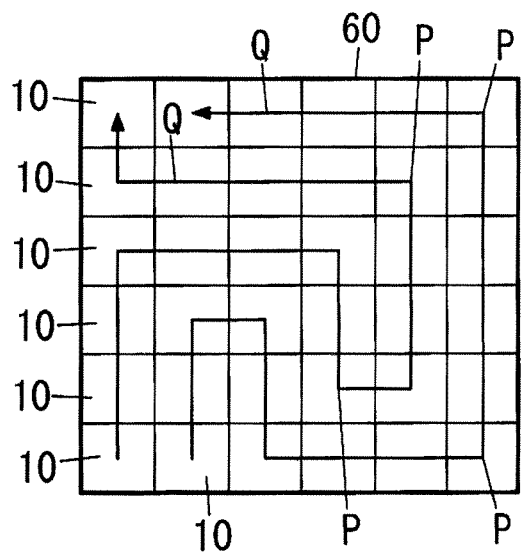
Figure 29E:
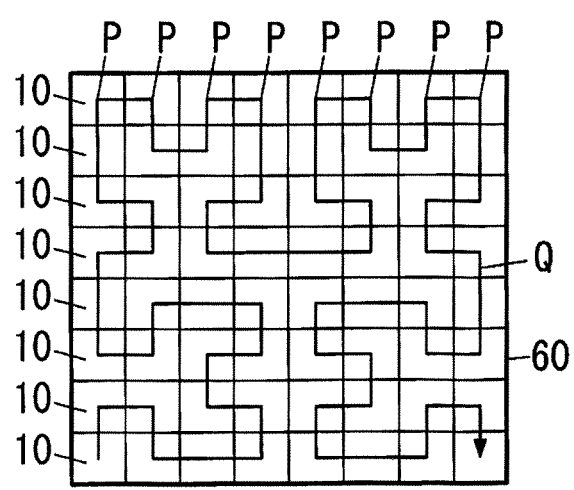
Figure 29F:
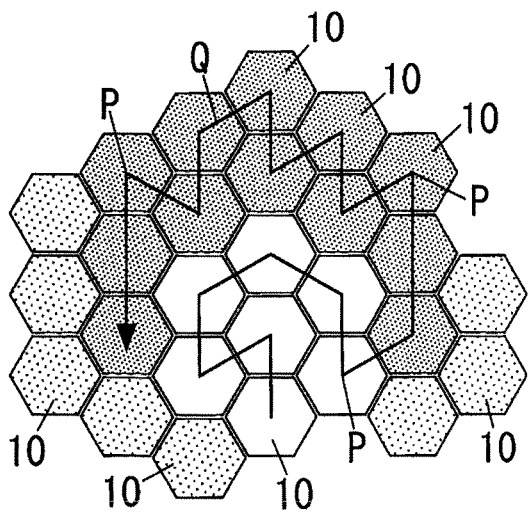
Figure 30:
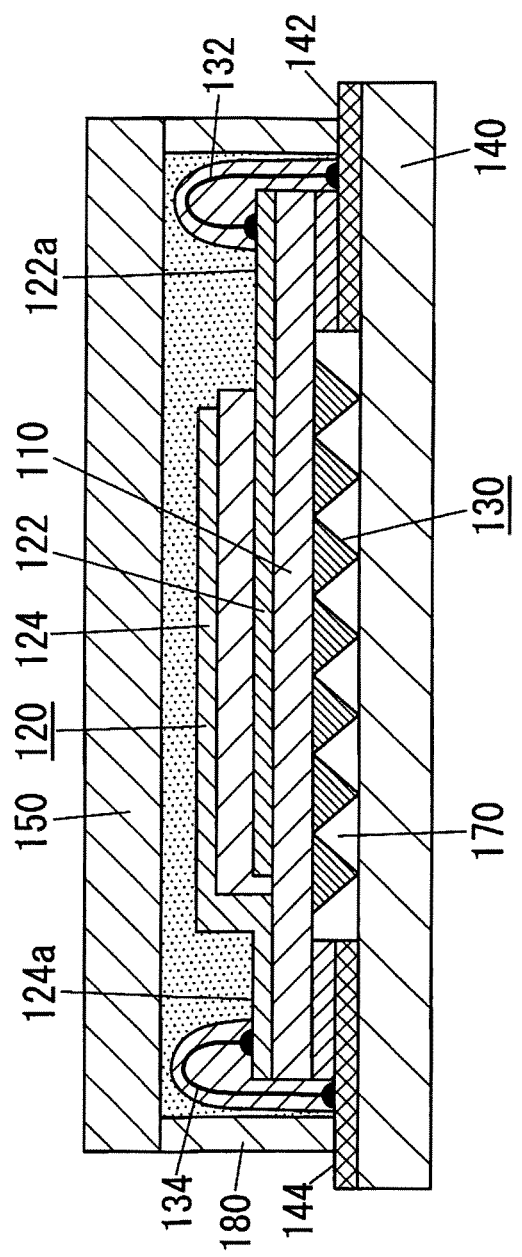
FIG. 30 is a cross-section illustrating a conventional light emission device.

Regarding the light emission device that has a plurality of electrical paths Q, an embodiment shown in FIG. 29D is illustrated. In order to form a plurality of electrical paths Q in the light emission device, one or more of comb shaped first patterned conductors 22 are preferably provided to the light emission device. Then, the plurality of the organic electroluminescent elements 10 are formed as a light-emitting module, and the light-emitting module is preferably electrically connected in parallel by the comb shaped first patterned conductor 22. Even when the plurality of electrical paths Q are formed in the light emission device in this way, each electrical path Q has the bend P and is formed as a traversable direct current circuit.

In order to form the aforementioned electrical path Q, the first patterned conductor 22 and the second patterned conductor 24 are formed as a pair at an adjoining location between the adjacent first substrates 11. When the electrical path Q is set by the patterned conductors, it is preferable that a side of the first substrate is disposed at an adjoining location where the above pair is not formed, and the first substrate 11 has 2 or more of these sides that are adjacent to the respective other first substrates. Further, in the light emission device (light-emitting module), in order to improve uniformity of emission luminance of each organic electroluminescent element 10, it is preferable that each of the plurality of electrical paths Q for direct currents pass through the same number of organic electroluminescent elements 10 (first substrates 11).

As described above, since the electrical path Q is formed as a traversable direct current path while having at least one bend in the light emission device (light-emitting module), even in a case where interconnection locations with external electrodes are limited, influence to the size of the light emission device can be reduced. In other words, even if the size of the light emission device is enlarged, interconnection areas with external electrodes can be minimized.

In the present embodiment, a plurality of polygonal (hexagonal in FIG. 29F) organic electroluminescent elements 10 (first substrate 11) may be arranged to form a light-emitting module. In this case also, similarly to the above, the electrical path Q can be formed as a traversable direct current path while having at least one bend P. In order to form the electrical path Q, a pair of the first patterned conductor 22 and the second patterned conductor 24 is present at an adjacent location between the adjacent first substrates 11. When the electrical path Q is constituted by the patterned conductors, it is preferable that the first substrate 11 has two or more sides over adjacent locations where the pairs are not present, and is adjacent to another first substrate.

In this way, due to forming the light-emitting module constituted by the polygonal organic electroluminescent elements 10 (first substrates 11), the light emission device can be enlarged, and the light emission device with a desired shape can be fabricated. Therefore, the design of the light emission device can be more flexible, and it is possible to reduce restrictions on the design of the light emitting device caused by a site at which the light emitting device is to be installed.

Furthermore, when the light-emitting module includes similar patterns as shown in FIGS. 29A to 29F, it is possible to easily change the size by changing the cut position and to fabricate the device with a desired shape. Therefore, it is possible to reduce an increase in the manufacturing cost caused by a change of design.

The invention claimed is:

1. A light emission device comprising:
an organic electroluminescent element including a first substrate, a functional layer, a first electrode, and a second electrode, the functional layer being disposed over a surface of the first substrate and including light-emitting layer;
a wiring board including a second substrate, a first patterned conductor, and a second patterned conductor, the first patterned conductor and the second patterned conductor being disposed on a surface of the second substrate;
a first connection part electrically connected to the first electrode and the first patterned conductor; and
a second connection part electrically connected to the second electrode and the second patterned conductor,
the first electrode and the second electrode including a first extended portion and a second extended portion which extend outside from sides of a light-emitting unit, respectively, the light-emitting unit being an overlap of the first electrode, the functional layer, and the second electrode,
the first extended portion and the second extended portion overlapping the first patterned conductor and the second patterned conductor in a thickness direction, respectively,
the organic electroluminescent element further including a first through hole and a second through hole, the first through hole penetrating the first extended portion and the first substrate, the second through hole penetrating the second extended portion and the first substrate,
the first connection part including a first through-hole wire and a first protrusion electrode, the first through-hole wire having a hollow cylindrical shape and being inside the first through hole, the first protrusion electrode protruding from the first patterned conductor along the thickness direction to be inside the first through-hole wire so as to be electrically connected to the first through-hole wire, the second connection part including a second through-hole wire and a second protrusion electrode, the second through-hole wire having a hollow cylindrical shape and being inside the second through hole, and the second protrusion electrode protruding from the second patterned conductor along the thickness direction to be inside the second through-hole wire so as to be electrically connected to the second through-hole wire.

2. The light emission device according to claim 1, further comprising:
a cover cooperating with the wiring board to accommodate the organic electroluminescent element; and
a resin member between the organic electroluminescent element and the cover in a thickness direction of the organic electroluminescent element.

3. The light emission device according to claim 1, wherein each of the first protrusion electrode and the second protrusion electrode is provided with a spacer to keep the second substrate and the organic electroluminescent element separated by a distance.

4. The light emission device according to claim 1, wherein each of the first protrusion electrode and the second protrusion electrode has an end having a tapered shape.

5. The light emission device according to claim 1,
the light emission device including a plurality of first substrates, and
the plurality of first substrates being arranged over the second substrate in such a manner to form a light-emitting module having at least one electrical path defining series and/or parallel electrical interconnection on the plurality of first substrates.

6. The light emission device according to claim 1, wherein the at least one electrical paths has a bend.

7. The light emission device according to claim 6, wherein the light-emitting module has parts electrically interconnected in parallel through the first patterned conductor formed into a comb shape.

8. The light emission device according to claim 6, comprising
two or more sets of the electrical paths each defining series electrical interconnection, wherein
the number of first substrates through which one of the two or more electrical paths pass is the same as the number of first substrates through which another of the two or more electrical paths pass.

9. The light emission device according to claim 6, comprising:
a plurality of organic electroluminescent elements including the plurality of first substrates; and
a single cover which covers the plurality of organic electroluminescent elements.

* * * * *